US012671221B2

(12) United States Patent
Fuchimukai

(10) Patent No.: US 12,671,221 B2
(45) Date of Patent: Jun. 30, 2026

(54) ULTRAVIOLET LASER DEVICE AND ELECTRONIC DEVICE MANUFACTURING METHOD

(71) Applicant: Gigaphoton Inc., Tochigi (JP)

(72) Inventor: Atsushi Fuchimukai, Oyama (JP)

(73) Assignee: Gigaphoton Inc., Tochigi (JP)

( * ) Notice: Subject to any disclaimer, the term of this patent is extended or adjusted under 35 U.S.C. 154(b) by 227 days.

(21) Appl. No.: 18/531,771

(22) Filed: Dec. 7, 2023

(65) Prior Publication Data

US 2024/0128701 A1 Apr. 18, 2024

Related U.S. Application Data

(63) Continuation of application No. PCT/JP2021/027529, filed on Jul. 26, 2021.

(51) Int. Cl.
*G03F 7/20* (2006.01)
*G02F 1/01* (2006.01)
(Continued)

(52) U.S. Cl.
CPC .......... *H01S 3/0064* (2013.01); *G02F 1/0136* (2013.01); *G02F 1/09* (2013.01);
(Continued)

(58) Field of Classification Search
CPC ...... H01S 3/0064; H01S 3/0014; H01S 3/225; H01S 3/2308; H01S 2302/00;
(Continued)

(56) References Cited

U.S. PATENT DOCUMENTS 5,528,415 A 6/1996 Gauthier et al.
2003/0174381 A1 9/2003 Ishiwada et al.
(Continued)

FOREIGN PATENT DOCUMENTS

JP S61-141189 A 6/1986
JP H03-67313 U1 7/1991
(Continued)

OTHER PUBLICATIONS

International Search Report issued in PCT/JP2021/027529; mailed Oct. 5, 2021.
(Continued)

*Primary Examiner* — Mesfin T Asfaw
(74) *Attorney, Agent, or Firm* — Studebaker Brackett PLLC

(57) ABSTRACT

An ultraviolet laser device includes an oscillation stage laser outputting linearly polarized pulse laser light having an ultraviolet wavelength, an optical isolator arranged on an optical path between the oscillation stage laser and an amplifier, and a processor. The optical isolator includes a first polarizer, a first Faraday rotator rotating a polarization direction of the pulse laser light transmitted through the first polarizer in a first rotation direction, a second polarizer arranged so that the pulse laser light output from the first Faraday rotator is transmitted therethrough, a first actuator relatively moving the first magnet and the first Faraday material in an optical axis direction, and a first sensor measuring a power of pulse laser light reflected by the second polarizer among the pulse laser light output from the oscillation stage laser. The processor controls the first actuator based on a measurement result of the first sensor.

21 Claims, 23 Drawing Sheets

(51) Int. Cl.

| | | |
|---|---|---|
| *G02F 1/09* | (2006.01) |
| *G03F 7/00* | (2006.01) |
| *H01S 3/00* | (2006.01) |
| *H01S 3/225* | (2006.01) |
| *H01S 3/23* | (2006.01) |

(52) U.S. Cl.
CPC ........ *G03F 7/2006* (2013.01); *G03F 7/70025* (2013.01); *G03F 7/70566* (2013.01); *H01S 3/0014* (2013.01); *H01S 3/225* (2013.01); *H01S 3/2308* (2013.01); *H01S 2302/00* (2013.01)

(58) Field of Classification Search
CPC .. H01S 3/08009; H01S 3/2366; G02F 1/0136; G02F 1/09; G03F 7/2006; G03F 7/70025; G03F 7/70566
See application file for complete search history.

(56) References Cited

U.S. PATENT DOCUMENTS

| | | | |
|---|---|---|---|
| 2013/0163073 A1 | 6/2013 | Ito |
| 2014/0346374 A1 | 11/2014 | Yanagida et al. |

| | | | | |
|---|---|---|---|---|
| 2016/0248219 A1* | 8/2016 | Wakabayashi | ........ | H01S 3/2375 |
| 2018/0236602 A1 | 8/2018 | Suzuki et al. | | |
| 2018/0356656 A1 | 12/2018 | Watanabe | | |
| 2019/0326722 A1 | 10/2019 | Kawasuji | | |
| 2021/0050213 A1* | 2/2021 | Savas | ................. | H01J 37/32119 |

FOREIGN PATENT DOCUMENTS

| | | | |
|---|---|---|---|
| JP | H03-273208 A | 12/1991 |
| JP | H09-68675 A | 3/1997 |
| JP | 2003-270603 A | 9/2003 |
| JP | 2004-062006 A | 2/2004 |
| JP | 2013-135075 A | 7/2013 |
| JP | 2013-218286 A | 10/2013 |
| JP | 2016-024357 A | 2/2016 |
| JP | 2018-205586 A | 12/2018 |
| WO | 2017/109928 A1 | 6/2017 |
| WO | 2018/154771 A1 | 8/2018 |

OTHER PUBLICATIONS

International Search Report and Written Opinion issued in PCT/JP2021/027529; issued Jan. 18, 2024.
"Notice of Reasons for Refusal" Office Action issued in JP 2023-537754; mailed by the Japanese Patent Office on Feb. 27, 2025.

* cited by examiner

ULTRAVIOLET LASER DEVICE AND ELECTRONIC DEVICE MANUFACTURING METHOD

CROSS-REFERENCE TO RELATED APPLICATIONS

The present application claims the benefit of International Application No. PCT/JP2021/027529, filed on Jul. 26, 2021, the entire contents of which are hereby incorporated by reference.

BACKGROUND

1. Technical Field

The present disclosure relates to an ultraviolet laser device and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device each have a large spectral line width of about 350 to 400 pm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. In the following, a gas laser device with a narrowed spectral line width is referred to as a line narrowing gas laser device.

LIST OF DOCUMENTS

Patent Documents

Patent Document 1: Japanese Patent Application Publication No. 2016-24357
Patent Document 2: Japanese Patent Application Publication No. H3-273208
Patent Document 3: Japanese Patent Application Publication No. 2004-62006

SUMMARY

An ultraviolet laser device according to an aspect of the present disclosure includes an oscillation stage laser configured to output linearly polarized pulse laser light having an ultraviolet wavelength; an amplifier configured to amplify and output the pulse laser light; an optical isolator arranged on an optical path between the oscillation stage laser and the amplifier; and a processor. Here, the optical isolator includes a first polarizer arranged so that the pulse laser light output from the oscillation stage laser is transmitted therethrough; a first Faraday rotator including a first magnet and a first Faraday material, and configured to rotate a polarization direction of the pulse laser light transmitted through the first polarizer in a first rotation direction; a second polarizer arranged so that the pulse laser light output from the first Faraday rotator is transmitted therethrough; a first actuator configured to relatively move the first magnet and the first Faraday material in an optical axis direction of the pulse laser light; and a first sensor configured to measure a power of pulse laser light reflected by the second polarizer among the pulse laser light output from the oscillation stage laser. The processor controls the first actuator based on a measurement result of the first sensor.

An ultraviolet laser device according to another aspect of the present disclosure includes an oscillation stage laser configured to output linearly polarized pulse laser light having an ultraviolet wavelength; an amplifier configured to amplify and output the pulse laser light; an optical isolator arranged on an optical path between the oscillation stage laser and the amplifier; and a processor. Here, the optical isolator includes a first polarizer arranged so that the pulse laser light output from the oscillation stage laser is transmitted therethrough; a first Faraday rotator including a first magnet and a first Faraday material, and configured to rotate a polarization direction of the pulse laser light transmitted through the first polarizer in a first rotation direction; a first actuator configured to relatively move the first magnet and the first Faraday material in an optical axis direction of the pulse laser light; and a third sensor configured to measure a power of light reflected by the first polarizer among light returning from the amplifier to the oscillation stage laser. The processor controls the first actuator based on a measurement result of the third sensor.

An ultraviolet laser device according to another aspect of the present disclosure includes an oscillation stage laser configured to output linearly polarized pulse laser light having an ultraviolet wavelength; an amplifier configured to amplify and output the pulse laser light; an optical isolator arranged on an optical path between the oscillation stage laser and the amplifier; a beam splitter arranged on an optical path between the oscillation stage laser and the optical isolator; a fourth sensor configured to measure a power of light reflected by the beam splitter; and a processor. Here, the optical isolator includes a first polarizer arranged so that the pulse laser light output from the oscillation stage laser is transmitted therethrough; a first Faraday rotator including a first magnet and a first Faraday material, and configured to rotate a polarization direction of the pulse laser light transmitted through the first polarizer in a first rotation direction; and a first actuator configured to relatively move the first magnet and the first Faraday material in an optical axis direction of the pulse laser light. The processor controls the first actuator based on a measurement result of the fourth sensor.

An electronic device manufacturing method according to another aspect of the present disclosure includes generating laser light amplified by an amplifier using an ultraviolet laser device; outputting the amplified laser light to an exposure apparatus; and exposing a photosensitive substrate to the laser light in the exposure apparatus to manufacture an electronic device. Here, the ultraviolet laser device includes an oscillation stage laser configured to output linearly polarized pulse laser light having an ultraviolet wavelength; the amplifier configured to amplify and output the pulse laser light; an optical isolator arranged on an optical path between the oscillation stage laser and the amplifier; and a processor. The optical isolator includes a first polarizer arranged so that the pulse laser light output from the oscillation stage laser is transmitted therethrough; a first Faraday rotator including a first magnet and a first Faraday material, and configured to rotate a polarization direction of the pulse laser light transmitted through the first polarizer in a first rotation direction; a second polarizer arranged so that the pulse laser light output from the first Faraday rotator is transmitted therethrough; a first actuator configured to relatively move the first magnet and the first Faraday material in an optical axis direction of the pulse laser light; and a first sensor configured to measure a power of pulse laser light reflected by the second polarizer among the pulse laser light output from the oscillation stage laser. The processor controls the first actuator based on a measurement result of the first sensor.

An electronic device manufacturing method according to another aspect of the present disclosure includes generating laser light amplified by an amplifier using an ultraviolet laser device; outputting the amplified laser light to an exposure apparatus; and exposing a photosensitive substrate to the laser light in the exposure apparatus to manufacture an electronic device. Here, the ultraviolet laser device includes an oscillation stage laser configured to output linearly polarized pulse laser light having an ultraviolet wavelength; the amplifier configured to amplify and output the pulse laser light; an optical isolator arranged on an optical path between the oscillation stage laser and the amplifier; and a processor. The optical isolator includes a first polarizer arranged so that the pulse laser light output from the oscillation stage laser is transmitted therethrough; a first Faraday rotator including a first magnet and a first Faraday material, and configured to rotate a polarization direction of the pulse laser light transmitted through the first polarizer in a first rotation direction; a first actuator configured to relatively move the first magnet and the first Faraday material in an optical axis direction of the pulse laser light; and a third sensor configured to measure a power of light reflected by the first polarizer among light returning from the amplifier to the oscillation stage laser. The processor controls the first actuator based on a measurement result of the third sensor.

BRIEF DESCRIPTION OF THE DRAWINGS

Embodiments of the present disclosure will be described below merely as examples with reference to the accompanying drawings.

FIG. 3 schematically shows the configuration of an optical isolator according to the comparative example in which return light is suppressed.

FIG. 5 is an explanatory diagram of the adjustment method of the optical isolator according to the comparative example.

FIG. 6 schematically shows the configuration of the ultraviolet laser device according to a first embodiment.

FIG. 15 schematically shows the configuration of the ultraviolet laser device according to a second embodiment.

FIG. 20 schematically shows the configuration of the ultraviolet laser device according to a third embodiment.

DESCRIPTION OF EMBODIMENTS

CONTENTS

Figure 1:
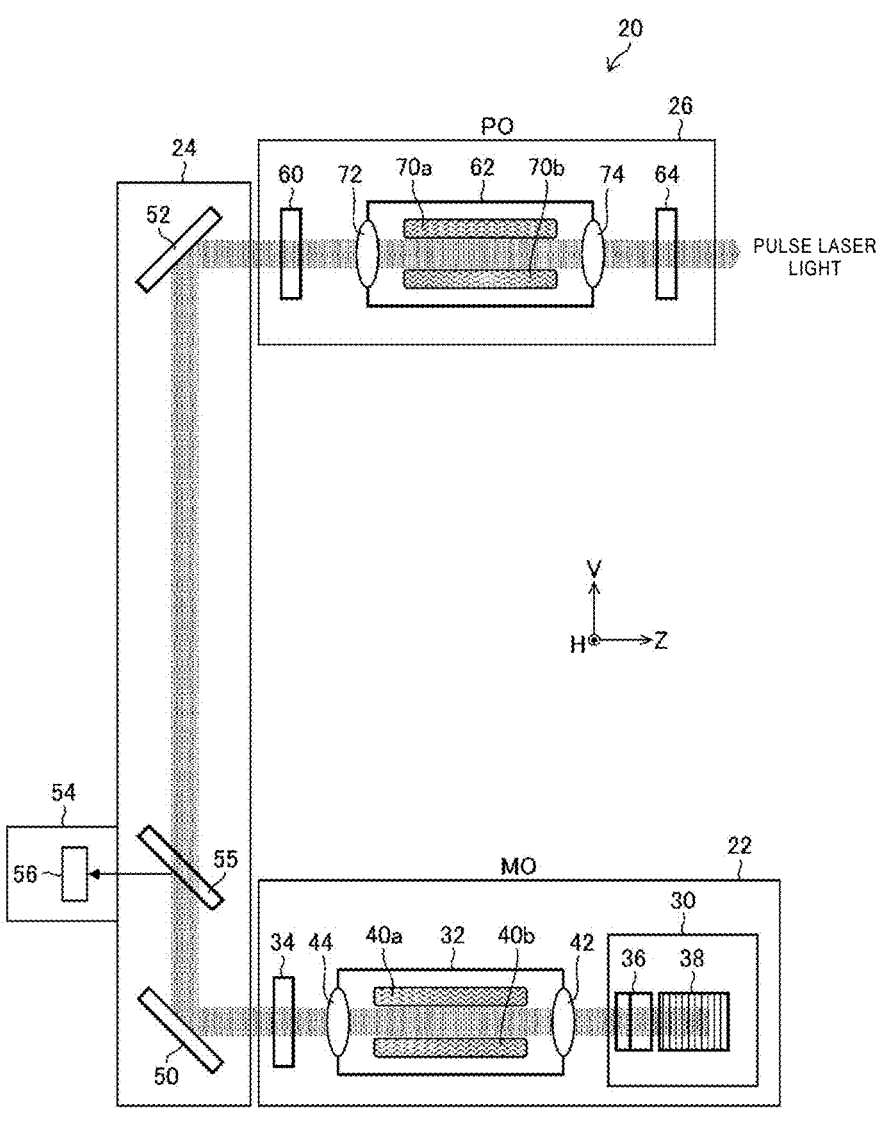
FIG. 1 is a side view schematically showing the configuration of an ultraviolet laser device according to a comparative example.

1. Description of terms
2. Overview of ultraviolet laser device according to comparative example
   2.1 Configuration
   2.2 Operation
3. Problem
4. First embodiment
   4.1 Configuration
   4.2 Operation
   4.3 Effect
   4.4 Modification 1-1
   4.5 Modification 1-2
5. Second embodiment
   5.1 Configuration
   5.2 Operation
   5.3 Effect
   5.4 Modification 2-1
   5.5 Modification 2-2
   5.6 Others
6. Third embodiment
   6.1 Configuration
   6.2 Operation
   6.3 Effect
   6.4 Modification 3
7. Other configuration examples of ultraviolet laser device
8. Electronic device manufacturing method
9. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Description of Terms

A "polarizer" refers to an optical element that separates light in a specific polarization direction (transmission axis direction) and light whose polarization direction is perpendicular thereto.

In the present specification, unless otherwise clear from the context, the term "parallel" is not limited to the case of being strictly parallel, and includes the concept of being substantially parallel including a range of angular difference that is practically acceptable without losing technical significance, unless otherwise specified. Further, in the present specification, unless otherwise clear from the context, the term "orthogonal" or "perpendicular" is not limited to the case of being strictly orthogonal or perpendicular, and includes the concept of being substantially orthogonal or substantially perpendicular including a range of angular difference that is practically acceptable without losing technical significance, unless otherwise specified.

2. Overview of Ultraviolet Laser Device According to Comparative Example

2.1 Configuration

FIG. 1 is a side view schematically showing the configuration of an ultraviolet laser device 20 according to a comparative example. The comparative example of the present disclosure is an example recognized by the applicant as known only by the applicant, and is not a publicly known example admitted by the applicant.

The ultraviolet laser device 20 is an excimer laser device including a master oscillator (MO) 22 being an oscillation stage laser, an MO beam steering unit 24, and a power oscillator (PO) 26 being an amplification stage laser. The MO 22 includes a line narrowing module (LNM) 30, a chamber 32, and an output coupling mirror 34.

The LNM 30 includes a prism expander 36 for narrowing the spectrum line width and a grating 38. The prism expander 36 and the grating 38 are arranged in the Littrow arrangement so that an incident angle and a diffraction angle coincide with each other. The output coupling mirror 34 is a partial reflection mirror having a reflectance of 40% to 60%. The output coupling mirror 34 is arranged to configure an optical resonator together with the LNM 30.

The chamber 32 is arranged on the optical path of the optical resonator. The chamber 32 includes a pair of discharge electrodes 40a, 40b and two windows 42, 44 through which laser light is transmitted. The chamber 32 is filled with a laser gas. The laser gas includes a rare gas, a halogen gas, and a buffer gas. The rare gas may be, for example, an argon (Ar) gas or a krypton (Kr) gas. The halogen gas may be, for example, a fluorine ($F_2$) gas. The buffer gas may be, for example, a neon (Ne) gas. A power source (not shown) applies a voltage between the discharge electrodes 40a, 40b. The power source may be a pulse power module (PPM) including a switch and a charging capacitor.

The MO beam steering unit 24 includes a high reflection mirror 50 and a high reflection mirror 52, and is arranged such that the laser light output from the MO 22 enters the PO 26.

An MO pulse energy monitor 54 is arranged between the high reflection mirror 50 and the high reflection mirror 52. The MO pulse energy monitor 54 includes a beam splitter (BS) 55 and an optical sensor 56. The BS 55 is arranged on the optical path of the pulse laser light output from the MO 22 such that the reflection light of the BS 55 enters the optical sensor 56.

The PO 26 is an amplification stage laser including a rear mirror 60, a chamber 62, and an output coupling mirror 64. The rear mirror 60 and the output coupling mirror 64 configure an optical resonator, and the chamber 62 is arranged on the optical path of the optical resonator.

The configuration of the chamber 62 may be similar to that of the chamber 32. The chamber 62 includes a pair of discharge electrodes 70a, 70b and two windows 72, 74. The chamber 62 is filled with a laser gas. The rear mirror 60 may be a partial reflection mirror having a reflectance of, for example, 50% to 90%. The output coupling mirror 64 may be a partial reflection mirror having a reflectance of 10% to 30%.

2.2 Operation

High voltage pulses are applied between the discharge electrodes 40a, 40b in the chamber 32 from the power source (not shown). When discharge occurs between the discharge electrodes 40a, 40b in the chamber 32, the laser gas is excited, and pulse laser light having an ultraviolet wavelength of 150 nm to 380 nm by being line-narrowed by the optical resonator configured by the output coupling mirror 34 and the LNM 30 is output from the output coupling mirror 34.

The energy of the pulse laser light output from the output coupling mirror 34 is measured by the MO pulse energy monitor 54. The pulse laser light is incident on the rear mirror 60 of the PO 26 as seed light by the MO beam steering unit 24.

At the timing when the seed light having transmitted through the rear mirror 60 enters the chamber 62, high voltage pulses are applied between the discharge electrodes 70a, 70b in the chamber 62 from the power source (not shown). When discharge occurs between the discharge electrodes 70a, 70b in the chamber 62, the laser gas is excited, the seed light is amplified by a Fabry-Perot optical resonator configured of an output coupling mirror 64 and a rear mirror 60, and the amplified pulse laser light is output from the output coupling mirror 64.

3. Problem

Figure 2:
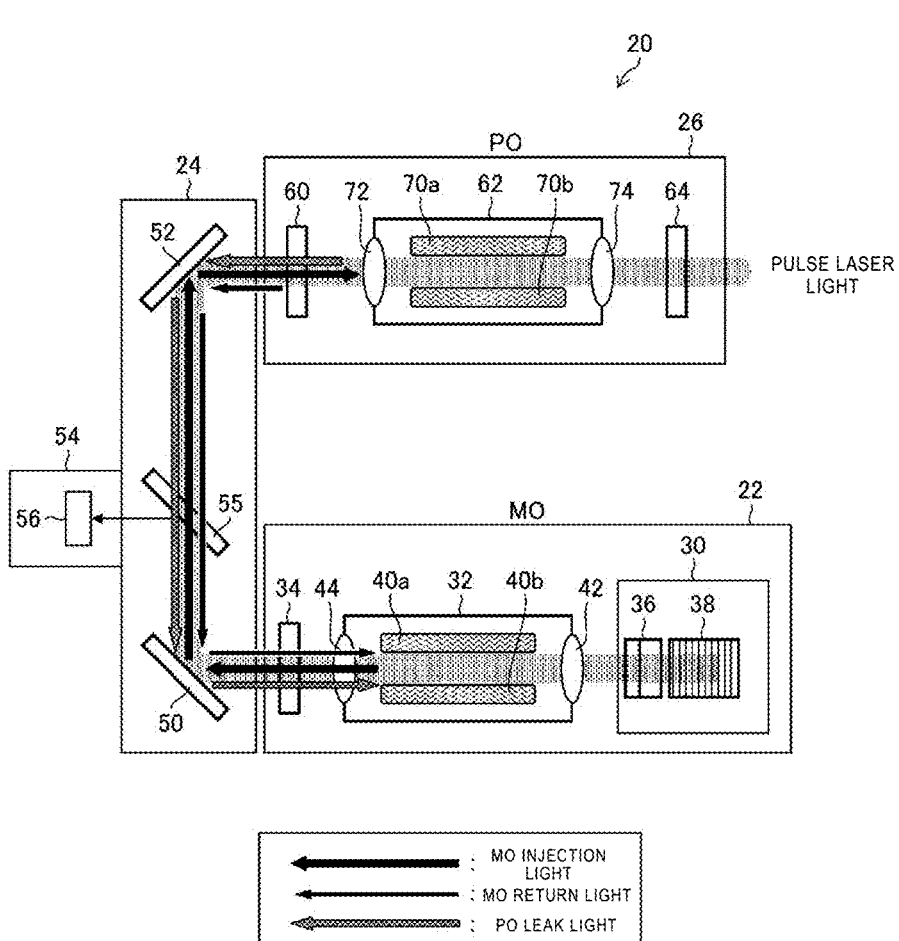
FIG. 2 is a view showing the problem of the ultraviolet laser device according to the comparative example.

FIG. 2 is a view showing the problem of the ultraviolet laser device 20 according to the comparative example. In the pulse laser light output from the MO 22, there is light returning from the PO 26 (return light), and when the return light from the PO 26 returns to the MO 22, the laser performance deteriorates. Here, there are two types of "return light", that is, MO return light and PO leak light. Light output from the MO 22 enters the PO 26. However, since the rear mirror 60 in the PO 26 is a partial reflection mirror (reflectance of 50% to 90%), a part of the light incident on the rear mirror 60 returns to the MO 22 without being directed to the inside of the PO 26. The light that is reflected by the rear mirror 60 and returns to the MO 22 side without traveling into the chamber 62 of the PO 26 is referred to as "MO return light."

On the other hand, the light that enters the PO 26 from the MO 22 and is transmitted through the rear mirror 60 is resonated and amplified in the PO 26 and then output. As described above, since the rear mirror 60 in the PO 26 is a partial reflection mirror, a part of the amplified light enters the chamber 62 of the PO 26 and returns to the MO 22. The light that is transmitted through the rear mirror 60 and returns to the MO 22 among the light amplified by the PO 26 is referred to as "PO leak light."

The return light from the PO 26 becomes a thermal load for the LNM 30 and the like, and may cause deterioration in the stability of the line width, the stability of the pulse energy, and the like. In order to suppress the return light entering the MO 22, there is a method of arranging an optical isolator between the MO 22 and the PO 26.

Figure 3:
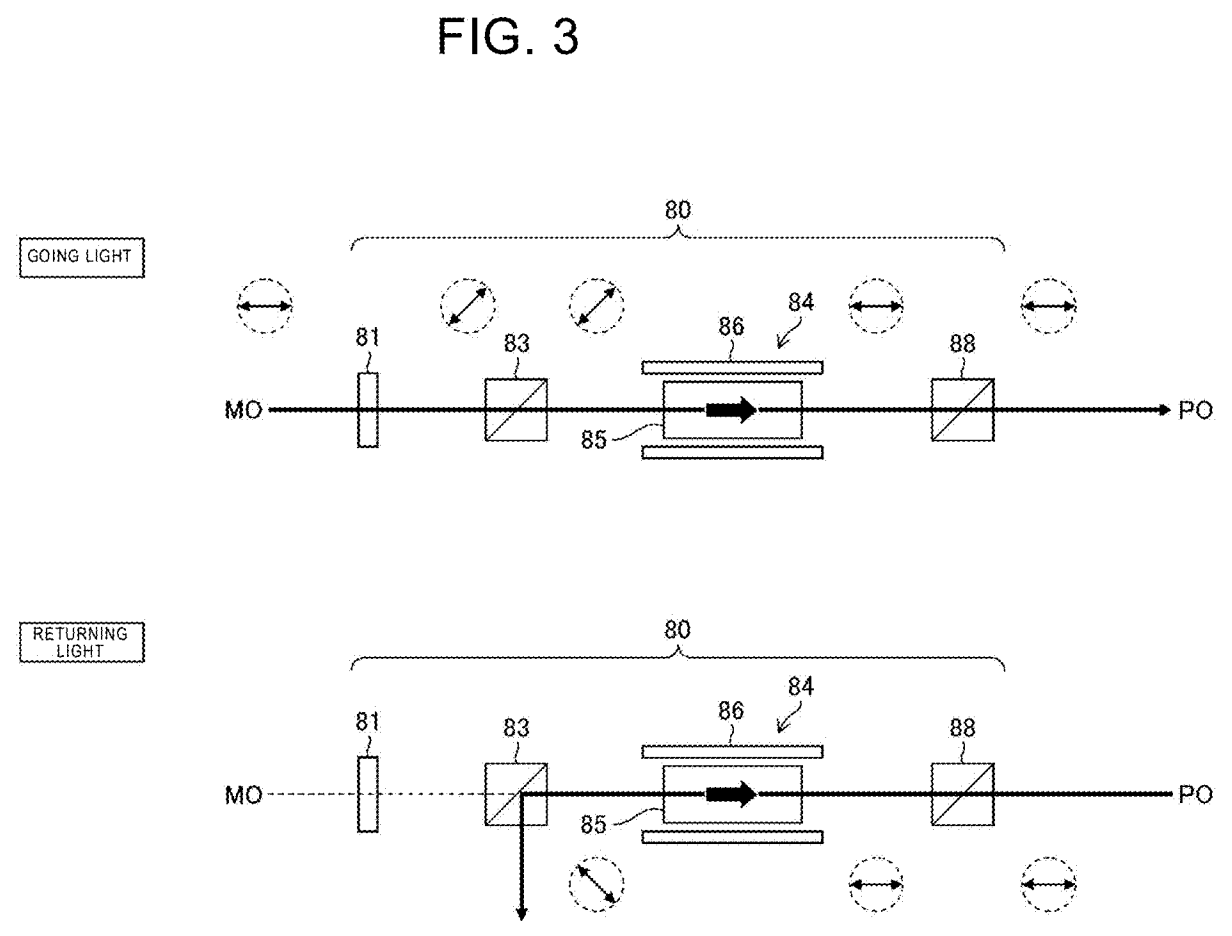

FIG. 3 schematically shows a configuration example of an optical isolator 80 according to a comparative example in which return light is suppressed. The optical isolator 80 is arranged between the MO 22 and the PO 26. The upper part of FIG. 3 shows the operation of the optical isolator 80 with respect to the pulse laser light (MO injection light: going light) traveling from the MO 22 toward the PO 26. The lower part of FIG. 3 shows the operation of the optical isolator 80 with respect to the laser light (returning light) traveling from the PO 26 toward the MO 22.

In the optical isolator 80, a half-wave plate 81, a first polarizer 83, a Faraday rotator 84, and a second polarizer 88 are arranged in this order from the MO 22 side. The Faraday rotator 84 includes a Faraday material 85 and a magnet 86. The magnet 86 has a hollow structure, and the Faraday material 85 is arranged therein via a holder. The internal space (hollow portion) of the magnet 86 in which the Faraday material 85 is arranged is a magnetic field generation portion that generates a magnetic field to be applied to the Faraday material 85. In FIG. 3, a rightward arrow shown in the Faraday rotator 84 indicates the direction of the magnetic field applied to the Faraday material 85 by the magnet 86. Double-headed arrows shown in broken line circles in FIG. 3 each indicate the direction of the polarization plane of the pulse laser light when the line of sight is aligned with the direction in which the pulse laser light travels, that is, the polarization direction.

As shown in the upper part of FIG. 3, linearly polarized pulse laser light polarized in a specific direction (the horizontal direction in this example) is output from the MO 22. The polarization direction of the linearly polarized pulse laser light output from the MO 22 is rotated by 45 degrees in the counterclockwise direction by the half-wave plate 81. The transmission axis of the first polarizer 83 is arranged parallel to the polarization direction of the pulse laser light output from the half-wave plate 81, and the pulse laser light output from the half-wave plate 81 is transmitted through the first polarizer 83.

The polarization direction of the pulse laser light having transmitted through the first polarizer 83 is rotated by 45 degrees in the clockwise direction by the Faraday material 85 to which the magnetic field is applied. As a result, the pulse laser light output from the Faraday rotator 84 becomes horizontally polarized light. The transmission axis of the second polarizer 88 is arranged parallel to the polarization direction of the pulse laser light output from the Faraday rotator 84, and the pulse laser light output from the Faraday rotator 84 is transmitted through the second polarizer 88 and then enters the PO 26.

The half-wave plate 81 adjusts the polarization direction of the pulse laser light output from the MO 22 so that the polarization direction of the pulse laser light output from the MO 22 and the polarization direction of the pulse laser light entering the PO 26 are the same. Thus, even when the optical isolator 80 is arranged, the polarization direction of the pulse laser light does not change before and after the optical isolator 80.

The polarization component of the return light, which is polarized in the same direction as the pulse laser light entering the PO 26, is transmitted through the second polarizer 88, and the polarization direction is rotated clockwise by 45 degrees by the Faraday material 85 to which the magnetic field is applied. Then, the light is reflected by the first polarizer 83, and the return light does not enter the MO 22.

The polarization component of the return light, which is polarized in a different direction from the pulse laser light entering the PO 26, is reflected by the second polarizer 88 and does not return to the MO 22. The second polarizer 88 is arranged to obtain a higher effect of the optical isolator 80 by removing the disturbed polarization component when the polarization of the return light from the PO 26 is disturbed. Therefore, when the polarization of the return light is not disturbed or when a sufficient extinction ratio can be obtained even with the disturbed return light, the second polarizer 88 may not be used.

Here, the ratio of the return light transmitted through the first polarizer 83 to the return light incident on the second polarizer 88 is referred to as the extinction ratio.

The optical isolator 80 is adjusted before laser mounting to obtain an appropriate effect of an optical isolator. The adjustment method will be described with reference to FIGS. 4 and 5. Here, the optical isolator 90 shown in FIGS. 4 and 5 includes a Faraday rotator 91 instead of the half-wave plate 81 shown in FIG. 3. This is because the Faraday material 95 configuring the Faraday rotator 91 has higher resistance to the laser light having the ultraviolet wavelength than the half-wave plate 81.

The Faraday rotator 91 has a structure similar to that of the Faraday rotator 84, and includes the Faraday material 95 and the magnet 96. The direction of the magnetic field applied to the Faraday material 95 by the magnet 96 of the Faraday rotator 91 is opposite to the direction of the magnetic field applied to the Faraday material 85 of the Faraday rotator 84.

The portion to be adjusted includes a relative position a1 in the optical axis direction of the pulse laser light of the Faraday material 95 with respect to the magnet 96, and a relative position a2 in the optical axis direction of the pulse laser light of the Faraday material 85 with respect to the magnet 86. The relative positions a1, a2 are adjusted to adjust the rotation amounts of the polarization planes of the pulse laser light in the Faraday rotators 91, 84. The rotation amount of the polarization plane of the pulse laser light in each of the Faraday rotators 91, 84 is determined by the physical quantity such as the strength of the magnetic field and the refractive index of the Faraday material 95, 85, and the length of the Faraday material 95, 85.

The adjustment procedure is, for example, as follows.

Step 1: A slit SL and a sensor SE1 are arranged between a light source LS and the optical isolator 90, and the power of the pulse laser light entering the optical isolator 90 via the slit SL is measured by the sensor SE1.

Figure 4:
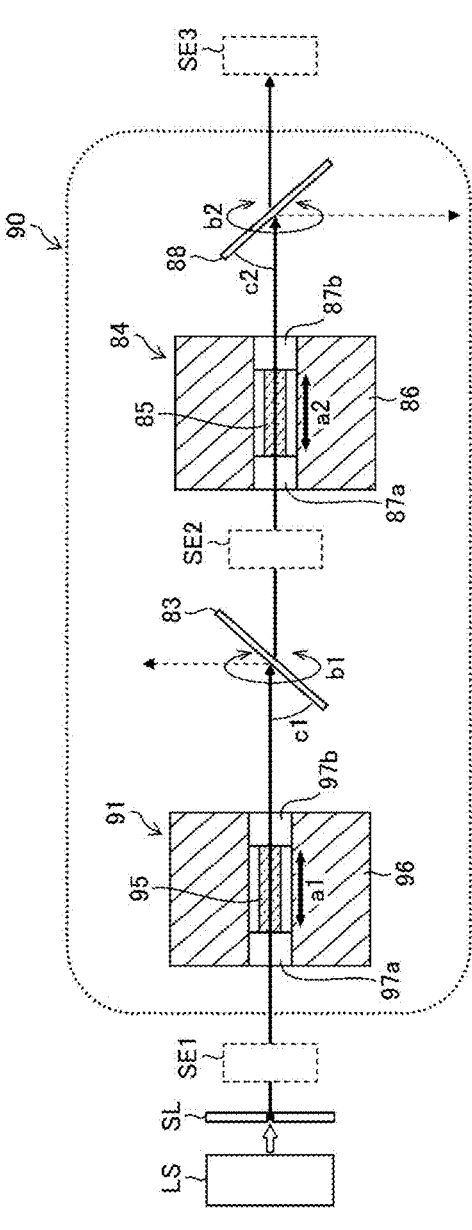
FIG. 4 is an explanatory diagram of an adjustment method of the optical isolator according to the comparative example.

Step 2: Thereafter, the sensor SE1 is removed, and the relative position a1 of the Faraday rotator 91 is adjusted. At this time, the first polarizer 83 is arranged at an angle b1 and an angle c1 being design values. The angle b1 is an angle in a rotation direction with an axis parallel to the optical axis being a rotation axis. The angle c1 is an inclination angle of the surface of the first polarizer 83 with respect to the optical axis. Then, a sensor SE2 is arranged at a position where the power of the pulse laser light transmitted through the first polarizer 83 can be measured. For example, as shown in FIG. 4, the sensor SE2 is arranged between the first polarizer 83 and the Faraday rotator 84. The relative position a1 of the Faraday rotator 91 is adjusted so that the output of the sensor SE2 is maximized, and fixed by spacers 97a, 97b and the like. The sensor SE2 is removed after adjusting the relative position a1.

Step 3: Next, a sensor SE3 is arranged at a position where the power of the pulse laser light transmitted through the second polarizer 88 can be measured, and the relative position a2 of the Faraday rotator 84 is adjusted. At this time, the second polarizer 88 is arranged at an angle b2 and an angle c2 being design values. The relative position a2 of the Faraday rotator 84 is adjusted so that the output of the sensor SE3 is maximized, and fixed by spacers 87a, 87b and the like. Then, the sensor SE3 is removed. The ratio between the output of the sensor SE3 and the output of the sensor SE1 defined as "sensor SE3 output/sensor SE1 output" is the transmittance of the optical isolator 90. The transmittance of the optical isolator 90 is, for example, about 65% in the case of the Faraday rotators 91, 84 which are not subjected to anti-reflection.

Figure 5:
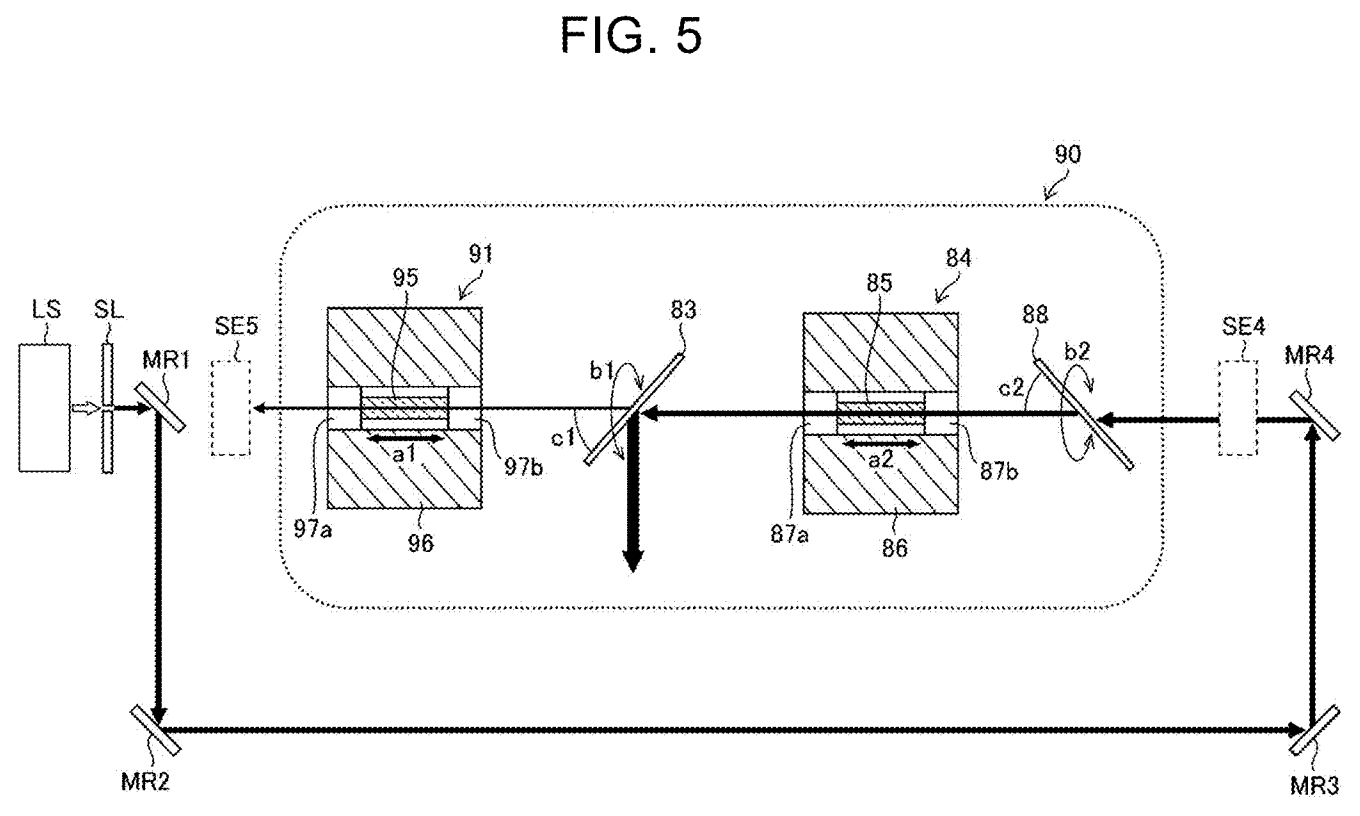

Step 4: Next, the extinction ratio is checked. At this time, as shown in FIG. 5, steering mirrors MR1, MR2, MR3, MR4 are arranged so that the pulse laser light output from the light source LS is transmitted through the second polarizer 88, the Faraday rotator 84, the first polarizer 83, and the Faraday rotator 91 in this order. The steering mirror MR1 is arranged between the slit SL and the optical isolator 90. The steering mirror MR2 is arranged to reflect the light reflected by the steering mirror MR1 to be incident on the steering mirror MR3. The steering mirror MR3 is arranged to reflect the light reflected by the steering mirror MR2 to be incident on the steering mirror MR4. The steering mirror MR4 is arranged to reflect the light reflected by the steering mirror MR3 to make the light incident on the second polarizer 88 of the light isolator 90 with the optical axis similar to that of the return light from the PO 26.

Then, a sensor SE4 is arranged between the steering mirror MR4 and the optical isolator 90, and the power of the pulse laser light entering the optical isolator 90 is measured by the sensor SE4. Then, the sensor SE4 is removed, and the sensor SE5 is arranged at a position where the power of the pulse laser light transmitted through the Faraday rotator 91 can be measured. The ratio between the output of the sensor SE4 and the output of the sensor SE5 defined as "sensor SE5 output/sensor SE4 output" is the extinction ratio. The extinction ratio is equal to or less than a predetermined value. For example, the extinction ratio is 1/10 or less.

When the optical isolator 90 adjusted as described above before laser mounting is mounted on the ultraviolet laser device 20 and used, the physical quantity such as the strength of the magnetic field and the refractive index of the Faraday materials 85, 95 is changed by the influence of heat during the laser operation, and the rotation amount of the polarization is changed.

When the rotation amount of the polarization in the optical isolator 90 is changed, the transmittance decreases and the extinction ratio deteriorates. When the transmittance decreases, stability of the pulse energy and the like of the pulse laser light output from the PO 26 deteriorates. Further, when the extinction ratio deteriorates, the return light to the MO 22 is increased, resulting in thermal load to the LMN 30 and the like, which causes stability of the spectral line width, stability of the pulse energy, and the like to deteriorate.

4. First Embodiment 4.1 Configuration

Figure 6:
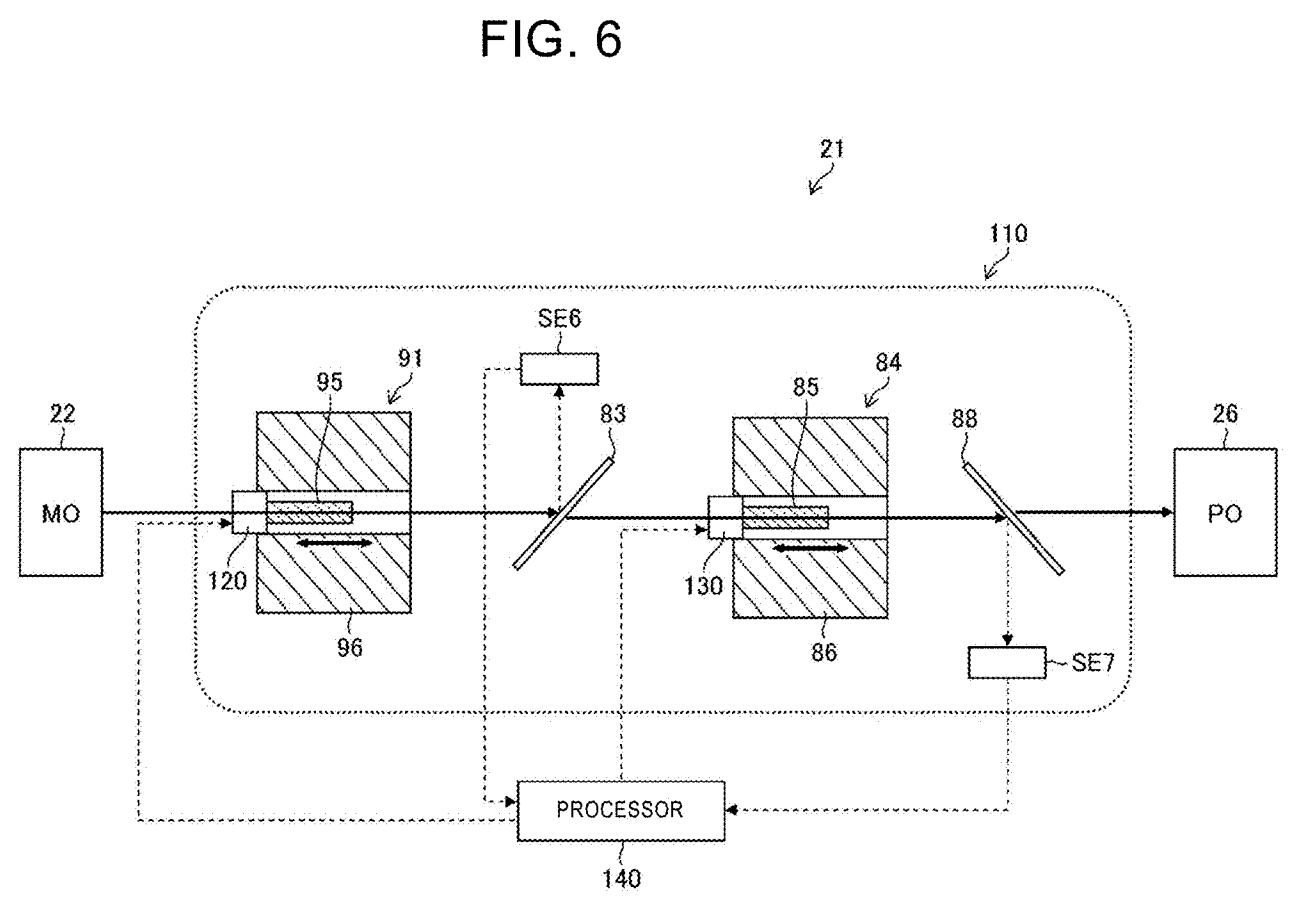

FIG. 6 schematically shows the configuration of an ultraviolet laser device 21 including an optical isolator 110 according to a first embodiment. The configuration shown in FIG. 6 will be described in terms of differences from the configuration shown in FIGS. 1, 4, and 5. In the ultraviolet laser device 21, the optical isolator 110 is arranged between the MO 22 and the PO 26. The optical isolator 110 may be arranged on an optical path between the beam splitter 55 and the high reflection mirror 52, which are not shown in FIG. 6. As the magnet 96 and the magnet 86, magnets are each selected to have a magnetic field strength with a slight margin for a predetermined rotation amount of the polarization plane in the Faraday rotator 91 and the Faraday rotator 84. The magnet 96 and the magnet 86 may be permanent magnets.

The Faraday materials 95, 85 are arranged at positions, as the initial relative position a1 and the relative position a2, each offset from a position where the magnetic field strength is maximized. For example, the center of the magnet 96 and the center of the Faraday material 95 are shifted by 2 mm from each other in the optical axis direction of the pulse laser light.

The optical isolator 110 is provided with an actuator 120 that moves the Faraday material 95 in the optical axis direction of the pulse laser light with respect to the magnet 96, and an actuator 130 that moves the Faraday material 85 in the optical axis direction of the pulse laser light with respect to the magnet 86. The movement amount of the Faraday material 95 by the actuator 120 is preferably half or more of the length in the optical axis direction of the pulse laser light of the Faraday material 95. The smallest movement amount of the actuator 120 may be, for example, about 0.2 mm. Further, the movement amount and the minimum movement amount of the actuator 130 may be the same as those of the actuator 120. The actuator 120 is simply required to be configured to relatively move the Faraday material 95 and the magnet 96 in the optical axis direction of the pulse laser light, and the magnet 96 may be moved with respect to the Faraday material 95 in the optical axis direction. Similarly, the actuator 130 is simply required to be configured to relatively move the Faraday material 85 and the magnet 86 in the optical axis direction of the pulse laser light, and the magnet 86 may be moved with respect to the Faraday material 85 in the optical axis direction.

The optical isolator 110 is provided with a sensor SE6 that detects the power of the pulse laser light reflected by the first polarizer 83 and a sensor SE7 that detects the power of the pulse laser light reflected by the second polarizer 88 among the pulse laser light propagating from the MO 22 to the PO 26.

The ultraviolet laser device 21 including the optical isolator 110 includes a processor 140 that receives output from the sensor SE6 and the sensor SE7 and controls the actuator 120 and the actuator 130. The processor 140 controls the actuator 120 based on the measurement result of the sensor SE6, and controls the actuator 130 based on the measurement result of the sensor SE7.

The processor 140 may function as a laser controller that controls the operation of the ultraviolet laser device 21. The processor 140 of the present disclosure is a processing device including a storage device in which a control program is stored and a central processing unit (CPU) that executes the control program. The processor 140 is specifically configured or programmed to perform various processes included in the present disclosure. The processor 140 may include an integrated circuit such as a field programmable gate array (FPGA) or an application specific integrated circuit (ASIC).

Figure 7:
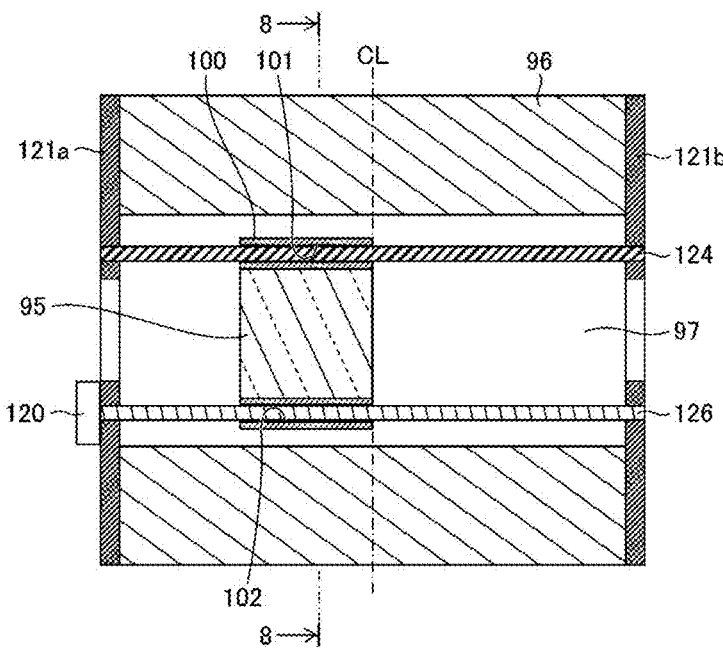
FIG. 7 is a sectional view showing details of the configuration of a Faraday rotator.
Figure 8:
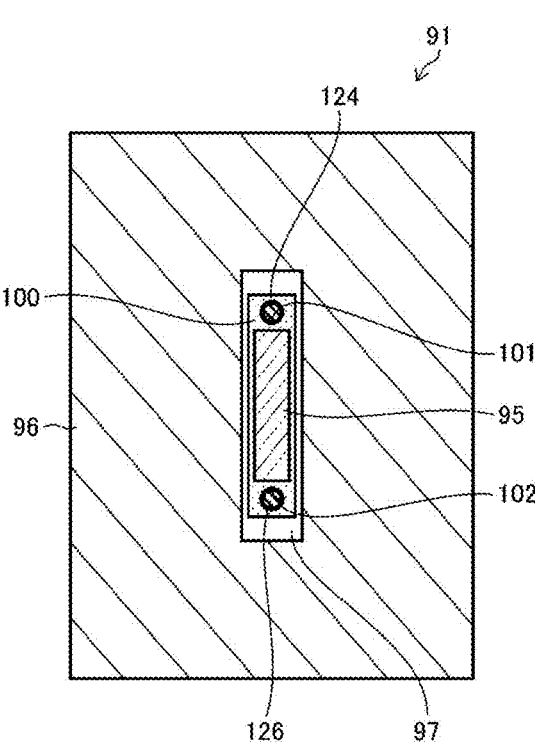
FIG. 8 is a sectional view taken along line 8-8 of FIG. 7.

FIG. 7 is a sectional view showing details of the configuration of the Faraday rotator 91. FIG. 7 shows a cross section parallel to the optical axis of the pulse laser light. A center line CL in FIG. 7 represents the center of the magnet 96. FIG. 8 is a sectional view taken along line 8-8 of FIG. 7.

Since the shape of the cross section perpendicular to the optical axis of the pulse laser light output from the MO 22 is a longitudinally elongated rectangle, the shape of the cross section of the Faraday material 95 may be a longitudinally elongated rectangle for reducing the size of the magnet 96.

The shape of the cross section of a magnetic field generation portion 97 of the magnet 96 in which the Faraday material 95 is arranged may be a longitudinally elongated rectangle in the same orientation as the shape of the cross section of the Faraday material 95. The Faraday material 95 is arranged in the magnetic field generation portion 97 of the magnet 96 in a state of being held by a Faraday material holder 100. The direction of the magnetic field penetrating through the Faraday material 95 is parallel to the propagation direction of light. The rotation direction of the polarization plane (polarization direction) by the Faraday rotator 91 depends on the sign of the Verdet constant and the direction of the applied magnetic field. The shape of the cross section of the Faraday material holder 100 perpendicular to the optical axis of the pulse laser light may be a longitudinally elongated rectangle similar to the Faraday material 95. The Faraday material holder 100 has a through hole 101 formed at one end in the longitudinal direction of the longitudinally elongated rectangle and a female screw 102 formed at the other end therein.

A guide shaft 124 is inserted to the through hole 101, and a male screw 126 is screwed to the female screw 102. The Faraday material holder 100 is held by a plate 121*a* and a plate 121*b* via the guide shaft 124 and the male screw 126. The male screw 126 is rotatably held and connected to the actuator 120. The plate 121*a* and the plate 121*b* also hold the magnet 96.

The Faraday material 95 and the Faraday material 85 may be made of the same material such as calcium fluoride (CaF$_2$). The configuration of the Faraday rotator 84 is similar to that of the Faraday rotator 91.

The Faraday rotator 84 is an example of the "first Faraday rotator" in the present disclosure, and the Faraday rotator 91 is an example of the "second Faraday rotator" in the present disclosure. The Faraday material 85 and the magnet 86 are examples of the "first Faraday material" and the "first magnet" in the present disclosure, and the Faraday material 95 and the magnet 96 are examples of the "second Faraday material" and the "second magnet" in the present disclosure. The rotation direction of the polarization plane of the pulse laser light by the Faraday rotator 84 is an example of the "first rotation direction" in the present disclosure. The rotation direction of the polarization plane of the pulse laser light by the Faraday rotator 91 is an example of the "second rotation direction" in the present disclosure. The actuator 130 is an example of the "first actuator" in the present disclosure, and the actuator 120 is an example of the "second actuator" in the present disclosure. The sensor SE7 is an example of the "first sensor" in the present disclosure, and the sensor SE6 is an example of the "second sensor" in the present disclosure.

4.2 Operation

The optical isolator 110 is mounted on the ultraviolet laser device 21 after being subjected to the respective adjustments (steps 1 to 4) described with reference to FIGS. 4 and 5. The ultraviolet laser device 21 is a laser device in which the optical isolator 110 is arranged on an optical path between the beam splitter 55 and the high reflection mirror 52 in the ultraviolet laser device 20 described with reference to FIG. 1.

Figure 9:
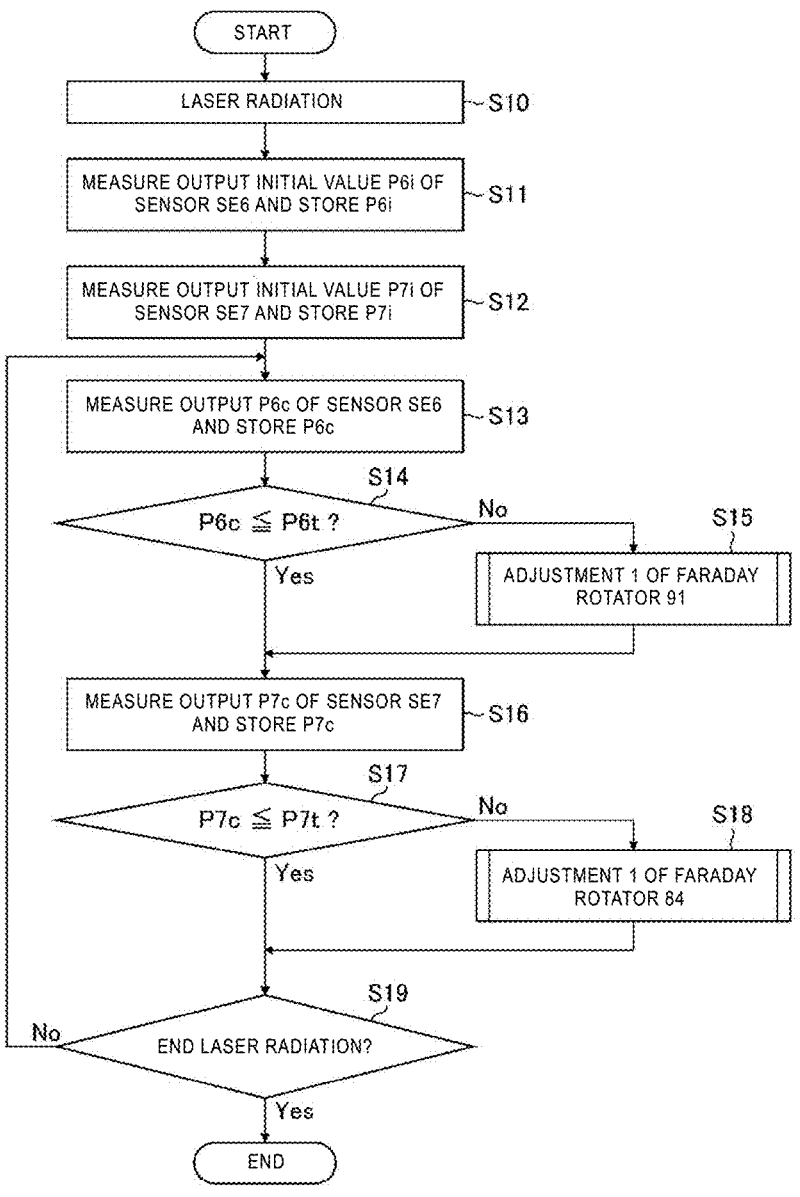
FIG. 9 is a flowchart showing a control example including the optical isolator in the ultraviolet laser device according to a first embodiment.

FIG. 9 is a flowchart showing a control example of the optical isolator 110 in the ultraviolet laser device 21. The steps shown in FIG. 9 may be realized by the processor 140 executing a program.

In step S10, the ultraviolet laser device 21 performs laser radiation. The laser radiation may be adjustment oscillation or laser operation for exposure for outputting laser light to an exposure apparatus.

In step S11, in the ultraviolet laser device 21, the sensor SE6 measures an output initial value P6i and the processor 140 stores the output initial value P6i.

In step S12, in the ultraviolet laser device 21, the sensor SE7 measures an output initial value P7i and the processor 140 stores the output initial value P7i. In subsequent steps, the processor 140 monitors the respective outputs of the sensor SE6 and the sensor SE7 during the laser radiation (during operation). When the rotation amount of the polarization plane in the optical isolator 110 changes due to the influence of heat and the like during the laser operation, the transmittance of each of the first polarizer 83 and the second polarizer 88 deteriorates, and the pulse laser light reflected by each of the first polarizer 83 and the second polarizer 88 increases. That is, by monitoring the respective outputs of the sensor SE6 and the sensor SE7, it is possible to capture the change in the rotation amount of the polarization plane.

In step S13, in the ultraviolet laser device 21, the sensor SE6 measures an output P6c and the processor 140 stores the output P6c.

In step S14, the processor 140 determines whether or not the output P6c is equal to or less than a target value P6t. The target value P6t may be, for example, 120% of the output initial value P6i (P6t=P6i×1.2). The target value P6t is an example of the "third target value" in the present disclosure.

When the determination result of step S14 is No, that is, when the output P6c of the sensor SE6 is more than the target value P6t, the processor 140 proceeds to step S15 and adjusts the relative position a1 by the actuator 120. The subroutine applied to step S15 will be described later with reference to FIG. 10. After step S15, the processor 140 proceeds to step S16.

On the other hand, when the determination result of step S14 is Yes, that is, when the output P6c of the sensor SE6 is equal to or less than the target value P6t, the processor 140 proceeds to step S16. In step S16, in the ultraviolet laser device 21, the sensor SE7 measures an output P7c and the processor 140 stores the output P7c.

In step S17, the processor 140 determines whether or not the output P7c is equal to or less than a target value P7t. The target value P7t may be, for example, 120% of the output initial value P7i (P7t=P7i×1.2). The target value P7t is an example of the "first target value" in the present disclosure.

When the determination result of step S17 is No, that is, when the output P7c of the sensor SE7 is more than the target value P7t, the processor 140 proceeds to step S18 and adjusts the relative position a2 by the actuator 130. The subroutine applied to step S18 will be described later with reference to FIG. 11. After step S18, the processor 140 proceeds to step S19.

On the other hand, when the determination result of step S17 is Yes, that is, when the output P7c of the sensor SE7 is equal to or less than the target value P7t, the processor 140 proceeds to step S19.

In step S19, the processor 140 determines whether or not to end the laser radiation. When the determination result of step S19 is No, that is, when the laser radiation is not to be ended, the processor 140 returns to step S13. Steps S13 to S19 are repeated until the laser radiation is ended.

On the other hand, when the determination result of step S19 is Yes, that is, when the laser radiation is to be ended, the processor 140 ends the flowchart of FIG. 9.

Figure 10:
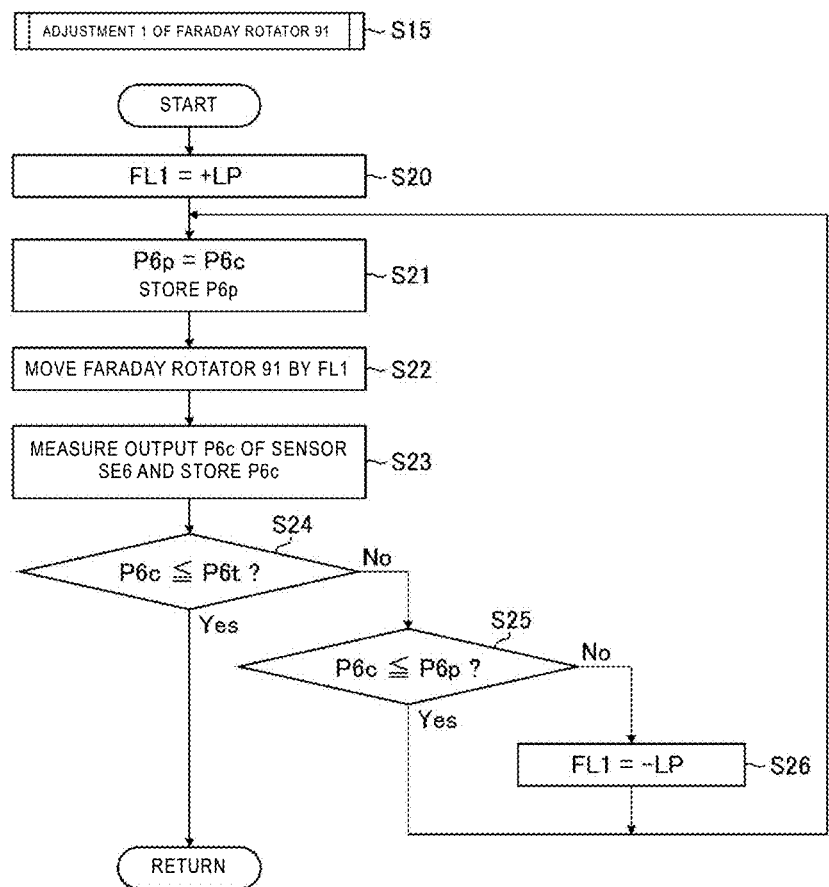
FIG. 10 is a flowchart showing an example of a processing content applied to step S15 of FIG. 9.

FIG. 10 is a flowchart showing an example of a processing content (adjustment 1 of the Faraday rotator 91) applied to step S15 of FIG. 9.

In step S20, the processor 140 sets a distance FL1 by which the Faraday material 95 is to be moved to +LP. Here, LP represents a predetermined movement amount when the Faraday material 95 or the Faraday material 85 is to be moved, and the direction in which the pulse laser light travels (propagates) from the MO 22 to the PO 26 is defined as a "+" direction. For example, LP may be 0.2 mm. In step S20, an initial value of the distance FL1 is set to +LP.

In step S21, the processor 140 stores the output P6c of the sensor SE6 as a pre-control output P6p.

Then, in step S22, the processor 140 causes the actuator 120 to move the Faraday material 95 of the Faraday rotator 91 by the distance FL1. After the Faraday material 95 is moved by FL1, in step S23, in the ultraviolet laser device 21, the sensor SE6 measures the output P6c and the processor 140 stores the output P6c.

In step S24, the processor 140 determines whether or not the output P6c is equal to or less than the target value P6t.

When the determination result of step S24 is No, that is, when the output P6c of the sensor SE6 is more than the target value P6t, the processor 140 proceeds to step S25. In step S25, the processor 140 determines whether or not the output P6c is equal to or less than the pre-control output P6p.

When the determination result of step S25 is Yes, that is, when the output P6c of the sensor SE6 is equal to or less than the pre-control output P6p, the processor 140 returns to step S21. On the other hand, when the determination result of step S25 is No, that is, when the output P6c of the sensor SE6 is more than the pre-control output P6p, the processor 140 proceeds to step S26 and sets the distance FL1 to −LP. After step S26, the processor 140 returns to step S21.

When the determination result of step S24 is Yes, that is, when the output P6c of the sensor SE6 is equal to or less than the target value P6t, the processor 140 ends the flowchart of FIG. 10 and returns to the flowchart of FIG. 9.

Figure 11:
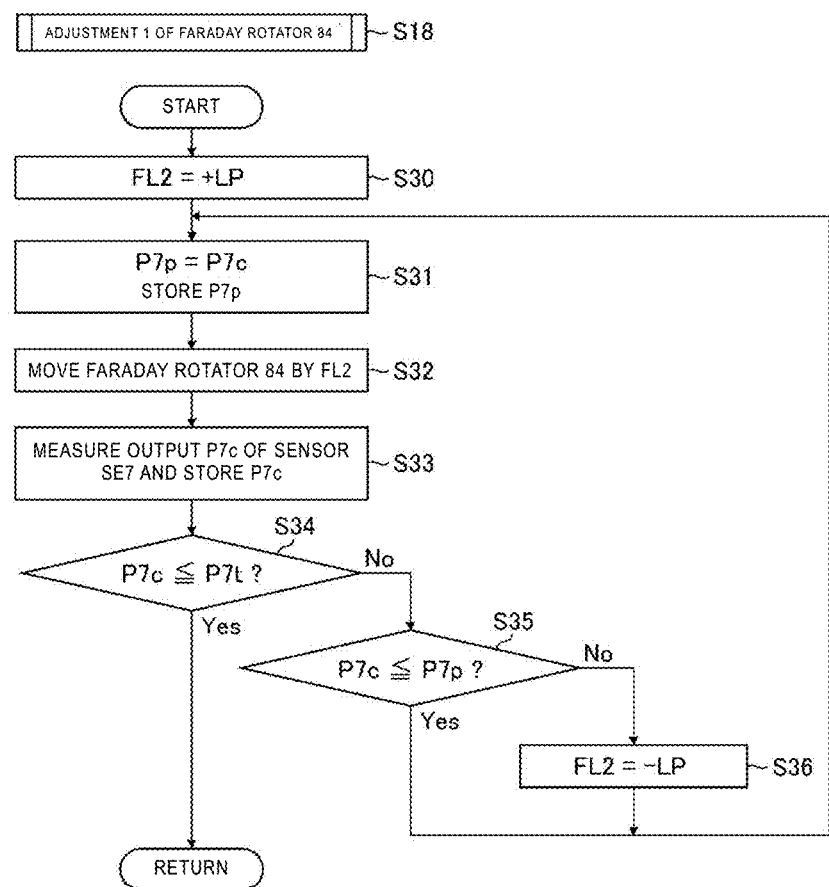
FIG. 11 is a flowchart showing an example of a processing content applied to step S18 of FIG. 9.

FIG. 11 is a flowchart showing an example of a processing content (adjustment 1 of the Faraday rotator 84) applied to step S18 of FIG. 9.

In step S30, the processor 140 sets a distance FL2 by which the Faraday material 85 is to be moved to +LP. In step S30, an initial value of the distance FL2 is set to +LP.

In step S31, the processor 140 stores the output P7c of the sensor SE7 as a pre-control output P7p.

Then, in step S32, the processor 140 causes the actuator 130 to move the Faraday material 85 of the Faraday rotator 84 by the distance FL2. After the Faraday material 85 is moved by FL2, in step S33, in the ultraviolet laser device 21, the sensor SE7 measures the output P7c and the processor 140 stores the output P7c.

In step S34, the processor 140 determines whether or not the output P7c is equal to or less than the target value P7t. When the determination result of step S34 is No, that is, when the output P7c of the sensor SE7 is more than the target value P7t, the processor 140 proceeds to step S35. In step S35, the processor 140 determines whether or not the output P7c is equal to or less than the pre-control output P7p.

When the determination result of step S35 is Yes, that is, when the output P7c is equal to or less than the pre-control output P7p, the processor 140 returns to step S31. On the other hand, when the determination result of step S35 is No, that is, when the output P7c is more than the pre-control output P7p, the processor 140 proceeds to step S36 and sets the distance FL2 to −LP. After step S36, the processor 140 returns to step S31.

When the determination result of step S34 is Yes, that is, when the output P7c of the sensor SE7 is equal to or less than the target value P7t, the processor 140 ends the flowchart of FIG. 11 and returns to the flowchart of FIG. 9.

4.3 Effect

According to the first embodiment, the transmittance and the extinction ratio of the optical isolator 110 can be adjusted during laser radiation. According to the first embodiment, even when the rotation amount of the polarization is changed due to the influence of heat and the like during laser operation, by controlling the relative position a1 in the optical axis direction of the pulse laser light of the Faraday material 95 with respect to the magnet 96 and the relative position a2 in the optical axis direction of the pulse laser light of the Faraday material 85 with respect to the magnet 86, decrease of the transmittance is suppressed and, deterioration of the extinction ratio is suppressed as well. As a result, it is possible to suppress deterioration of stability of the pulse energy and the like of the pulse laser light output from the PO 26 due to the decrease of the transmittance of the optical isolator 110 and deterioration of stability of the spectral line width, stability of the pulse energy, and the like due to thermal load on the LMN 30 and the like caused by the return light to the MO 22.

According to the first embodiment, the optical isolator 110 can be automatically optimized and operated even during the exposure operation. Further, according to the first embodiment, it is possible to control the optical isolator 110 to be automatically adjusted not only during the exposure operation but also during the adjustment oscillation.

4.4 Modification 1-1

Figure 12:
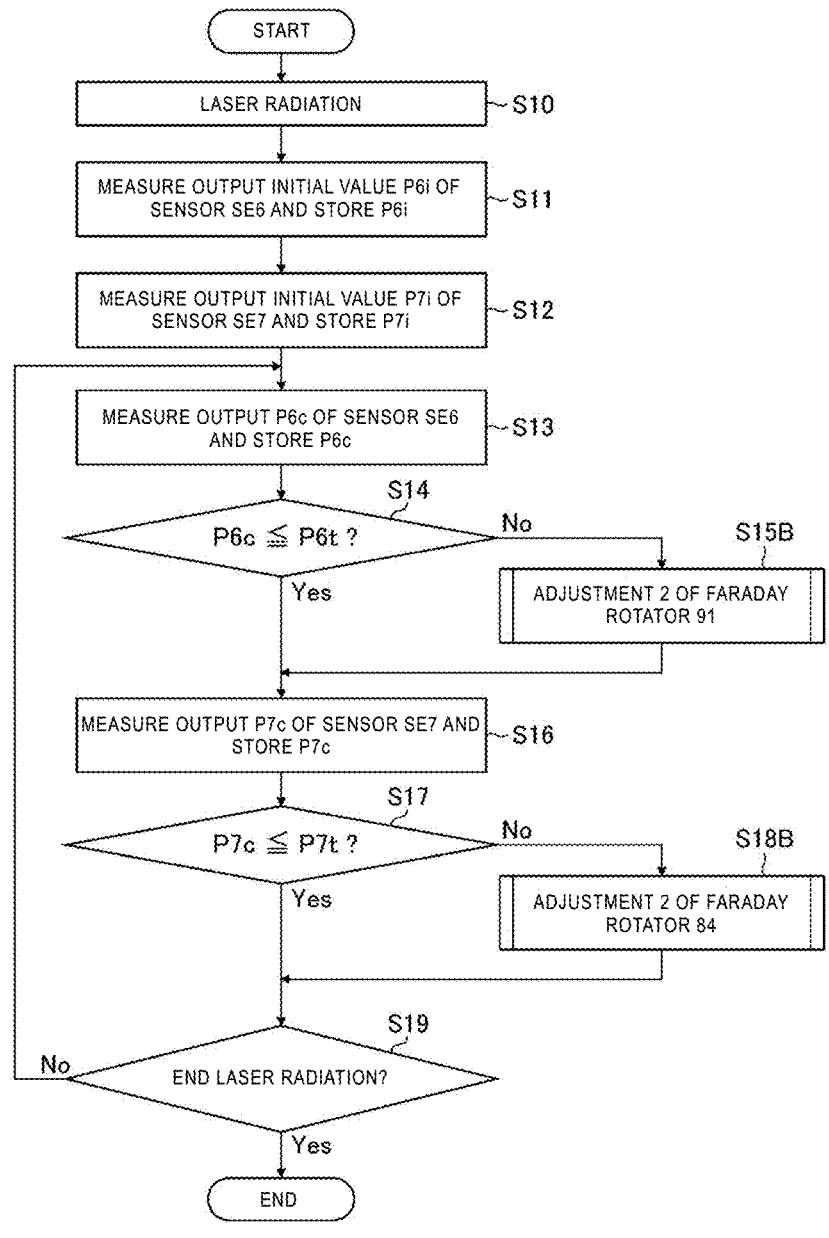
FIG. 12 is a flowchart showing another control example of the optical isolator in the ultraviolet laser device.
Figure 13:
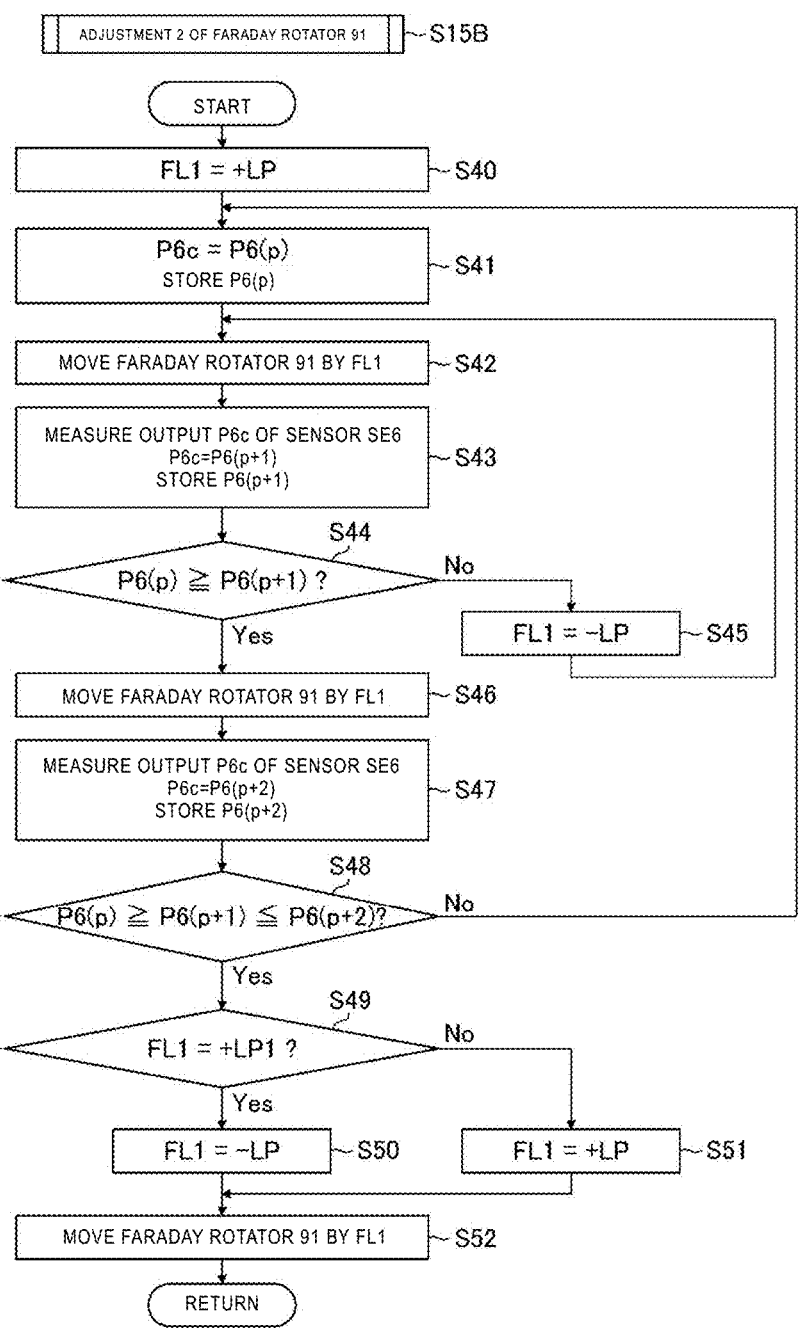
FIG. 13 is a flowchart showing an example of a processing content applied to step S15B of FIG. 12.
Figure 14:
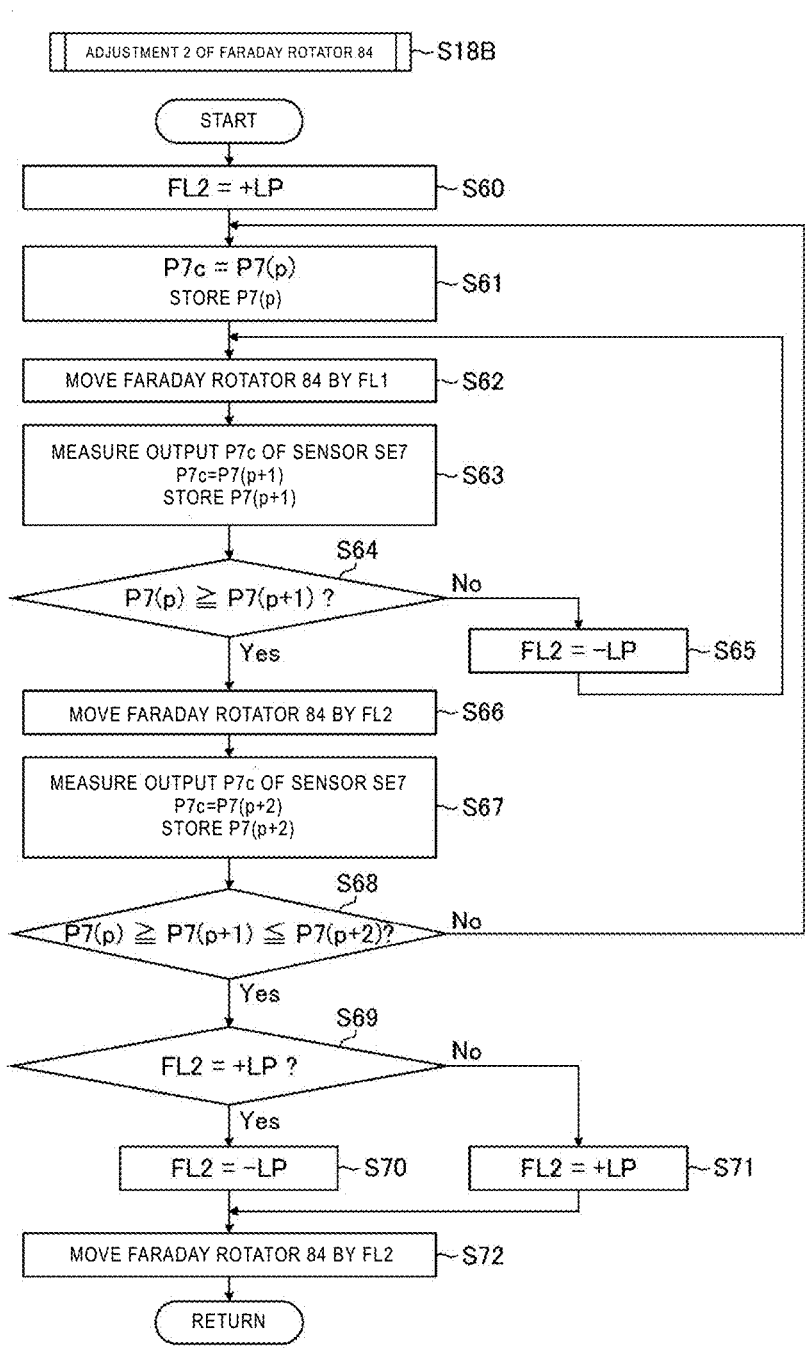
FIG. 14 is a flowchart showing an example of a processing content applied to step S18B of FIG. 12.

FIGS. 12 to 14 are flowcharts showing another control example of the optical isolator 110 in the ultraviolet laser device 21. Instead of the flowcharts of FIGS. 9 to 11, the flowcharts of FIGS. 12 to 14 may be adopted. The flowcharts shown in FIGS. 12 to 14 will be described in terms of differences from those shown in FIGS. 9 to 11.

In the flowchart of FIG. 12, steps S15B and S18B are included in place of steps S15 and S18 of FIG. 9.

When the determination result of step S14 is No, the processor 140 proceeds to step S15B and performs the process of adjustment 2 of the Faraday rotator 91. Details of the subroutine applied to step S15B will be described later with reference to FIG. 13.

Further, when the determination result of step S17 is No, the processor 140 proceeds to step S18B and performs the process of adjustment 2 of the Faraday rotator 84. Details of the subroutine applied to step S18B will be described later with reference to FIG. 14. Other steps may be similar to those in FIG. 11.

FIG. 13 is a flowchart showing an example of a processing content (adjustment 2 of the Faraday rotator 91) applied to step S15B of FIG. 12. In the flowchart of FIG. 10, the example in which the output P6$c$ of the sensor SE6 is controlled to be equal to or less than the target value P6t has been described, but the flowchart shown in FIG. 13 is an example in which the output P6c of the sensor SE6 is controlled to be the minimum value.

In step S40 of FIG. 13, the processor 140 sets the distance FL1 by which the Faraday material 95 is to be moved to +LP.

In step S41, the processor 140 stores the output P6c of the sensor SE6 as the output P6(p) of the index p. Here, p representing the index number may be any integer, for example, p may be 0.

Then, in step S42, the processor 140 causes the actuator 120 to move the Faraday material 95 of the Faraday rotator 91 by the distance FL1. After the Faraday material 95 is moved by FL1, in step S43, in the ultraviolet laser device 21, the sensor SE6 measures the output P6c and the processor 140 stores the output P6c as the output P6(p+1) of the index p+1.

Then, in step S44, the processor 140 determines whether or not P6(p) is equal to or more than P6(p+1). This determination is used to determine the direction of movement of the Faraday material 95. When the determination result of step S44 is No, that is, when P6(p)<P6(p+1) is satisfied, the processor 140 proceeds to step S45. In step S45, the processor 140 sets the distance FL1 to −LP and reverses the movement direction. After step S45, the processor 140 returns to step S42.

When the determination result of step S44 is Yes, that is, when P6(p)≥P6(p+1) is satisfied, the processor 140 proceeds to step S46.

In step S46, the processor 140 causes the actuator 120 to move the Faraday material 95 of the Faraday rotator 91 by the distance FL1.

Then, in step S47, in the ultraviolet laser device 21, the sensor SE6 measures the output P6c and the processor 140 stores the output P6c as the output P6(p+2) of the index p+2.

Then, in step S48, the processor 140 determines whether or not P6(p)≥P6(p+1)≤P6(p+2) is satisfied. This determination is a process for searching the minimum value of the output P6c of the sensor SE6. When the determination result of step S48 is No, that is, when P6(p+2) is less than P6(p+1), since the minimum value cannot be specified, the processor 140 returns to step S41 and repeats steps S41 to S48.

When the determination result of step S48 is Yes, that is, when P6(p)≥P6(p+1)≤P6(p+2) is satisfied, the processor 140 specifies that P6(p+1) is the minimum value and proceeds to step S49.

In step S49, the processor 140 determines whether or not the setting of the distance FL1 is +LP. When the determination result of step S49 is Yes, that is, when FL1=+LP is satisfied, the processor 140 proceeds to step S50 and sets the distance FL1 to −LP. On the other hand, when the determination result of step S49 is No, that is, when FL1=−LP is satisfied, the processor 140 proceeds to step S51 and sets the distance FL1 to +LP.

After step S50 or step S51, the processor 140 proceeds to step S52. In step S52, the processor 140 causes the actuator 120 to move the Faraday material 95 of the Faraday rotator 91 by the distance FL1. Due to step S52, the Faraday material 95 moves to a position corresponding to the index p+1 at which the output of the sensor SE6 is determined to be the minimum value (P6(p+1)). After step S52, the processor 140 ends the flowchart of FIG. 13 and returns to the flowchart of FIG. 12.

The minimum value of the output P6c of the sensor SE6 specified by the determination of step S48 is an example of the "fourth target value" in the present disclosure.

FIG. 14 is a flowchart showing an example of a processing content (adjustment 2 of the Faraday rotator 84) applied to step S18B of FIG. 12. In the flowchart of FIG. 11, the example in which the output P7c of the sensor SE7 is controlled to be equal to or less than the target value P7t has been described, but the flowchart shown in FIG. 14 is an example in which the output P7c of the sensor SE7 is controlled to be the minimum value.

In step S60 of FIG. 14, the processor 140 sets the distance FL2 by which the Faraday material 85 is to be moved to +LP.

In step S61, the processor 140 stores the output P7c of the sensor SE7 as the output P7(p) of the index p.

Then, in step S62, the processor 140 causes the actuator 130 to move the Faraday material 85 of the Faraday rotator 84 by the distance FL2. After the Faraday material 85 is moved by FL2, in step S63, in the ultraviolet laser device 21, the sensor SE7 measures the output P7c and the processor 140 stores the output P7c as the output P7(p+1) of the index p+1.

Then, in step S64, the processor 140 determines whether or not P7(p) is equal to or more than P7(p+1). This determination is used to determine the direction of movement of the Faraday material 85. When the determination result of step S64 is No, that is, when P7(p)<P7(p+1) is satisfied, the processor 140 proceeds to step S65. In step S65, the processor 140 sets the distance FL2 to −LP and reverses the movement direction. After step S65, the processor 140 returns to step S62.

When the determination result of step S64 is Yes, that is, when P7(p)≥P7(p+1) is satisfied, the processor 140 proceeds to step S66.

In step S66, the processor 140 causes the actuator 130 to move the Faraday material 85 of the Faraday rotator 84 by the distance FL2.

Then, in step S67, in the ultraviolet laser device 21, the sensor SE7 measures the output P7c and the processor 140 stores the output P7c as the output P7(p+2) of the index p+2.

Then, in step S68, the processor 140 determines whether or not P7(p)≥P7(p+1)≤P7(p+2) is satisfied. This determination is a process for searching the minimum value. When the determination result of step S68 is No, that is, when P7(p+2) is less than P7(p+1), since the minimum value cannot be specified, the processor 140 returns to step S61 and repeats steps S61 to S68.

When the determination result of step S68 is Yes, that is, when P7(p)≥P7(p+1)≤P7(p+2) is satisfied, the processor 140 specifies that P7(p+1) is the minimum value and proceeds to step S69.

In step S69, the processor 140 determines whether or not the setting of the distance FL2 is +LP. When the determination result of step S69 is Yes, that is, when FL2=+LP is satisfied, the processor 140 proceeds to step S70 and sets the distance FL2 to −LP. On the other hand, when the determination result of step S69 is No, that is, when FL2=−LP is satisfied, the processor 140 proceeds to step S71 and sets the distance FL2 to +LP.

After step S70 or step S71, the processor 140 proceeds to step S72. In step S72, the processor 140 causes the actuator 130 to move the Faraday material 85 of the Faraday rotator 84 by the distance FL2. Due to step S71, the Faraday material 85 moves to a position corresponding to the index p+1 at which the output P7c of the sensor SE7 is determined to be the minimum value. After step S72, the processor 140 ends the flowchart of FIG. 14 and returns to the flowchart of FIG. 12.

The minimum value of the output P7c of the sensor SE7 specified by the determination of step S68 is an example of the "second target value" in the present disclosure. By applying the control method of Modification 1-1, similar effects can be obtained as the first embodiment.

4.5 Modification 1-2

The Faraday rotator 91 is an optical system that rotates the polarization direction by 45 degrees. Instead of the Faraday rotator 91, for example, a retarder (e.g., half-wave plate 81) for shifting a phase by 180 degrees may be used. In this case, the sensor SE6 and the actuator 120 do not have to be arranged.

5. Second Embodiment

5.1 Configuration

Figure 15:
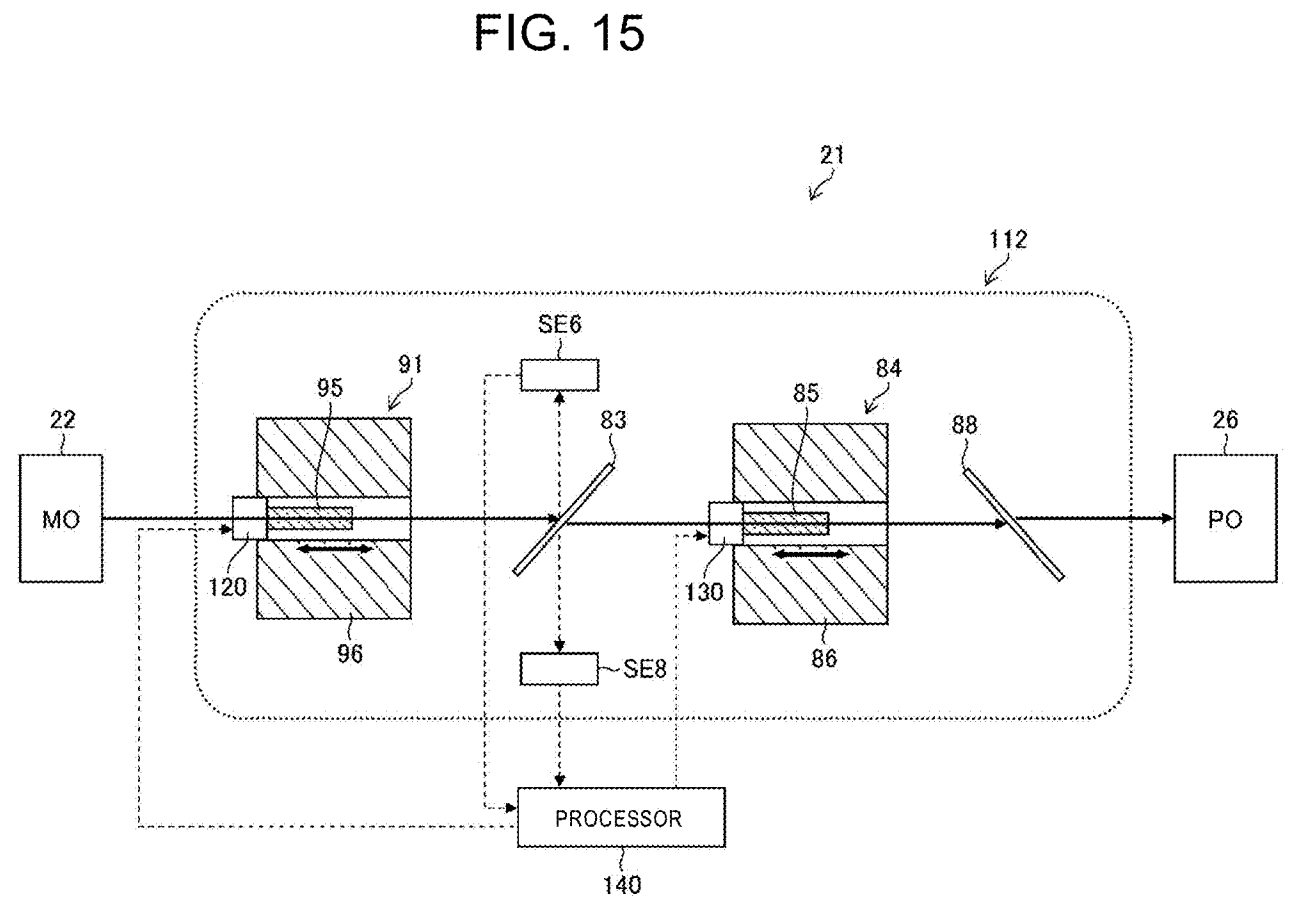

FIG. 15 schematically shows the configuration of the ultraviolet laser device 21 including an optical isolator 112 according to a second embodiment. The configuration shown in FIG. 15 will be described in terms of differences from the configuration shown in FIG. 6. The optical isolator 112 shown in FIG. 15 includes, instead of the sensor SE7 in FIG. 6, a sensor SE8 that detects the power of the light reflected by the first polarizer 83 among the light returning from the PO 26 to the optical isolator 112. Other configurations are similar to those of the first embodiment. The sensor SE8 is an example of the "third sensor" in the present disclosure.

5.2 Operation

Figure 16:
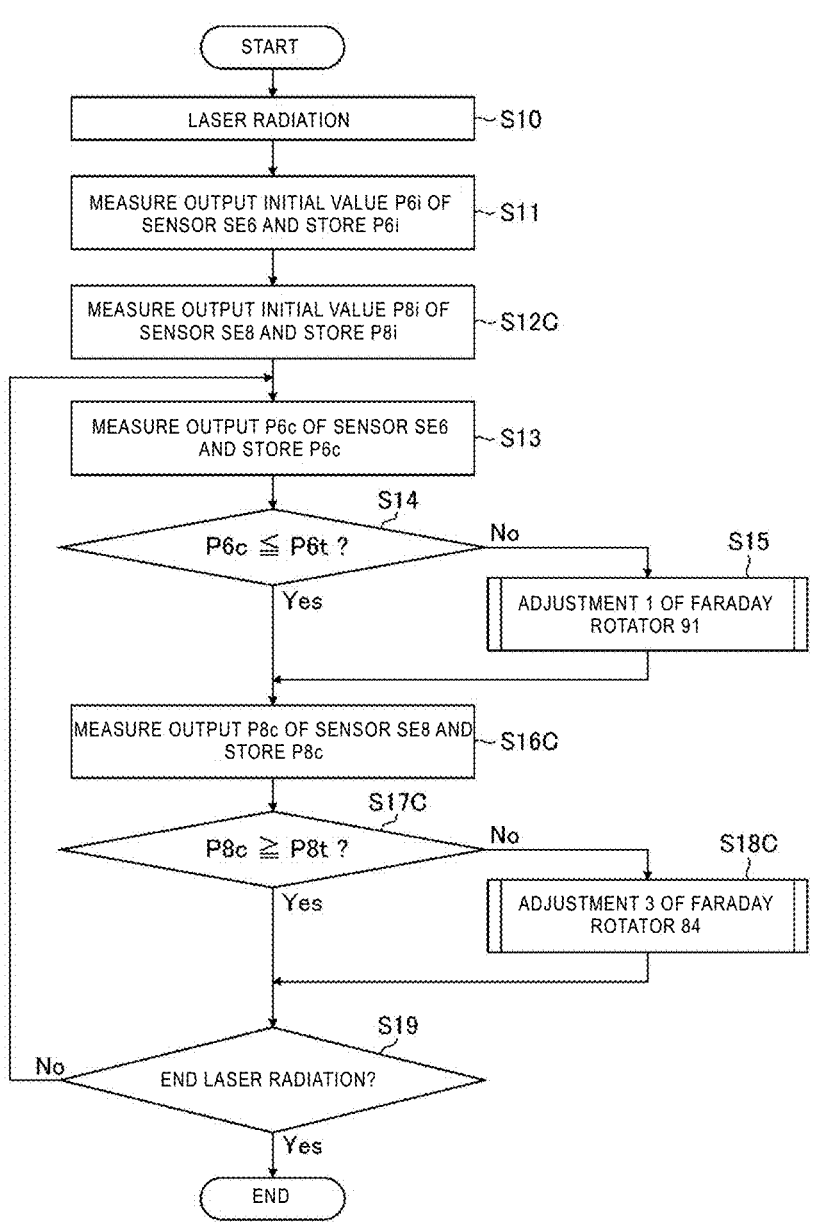
FIG. 16 is a flowchart showing a control example of the optical isolator of the ultraviolet laser device according to the second embodiment.

FIG. 16 is a flowchart showing a control example including the optical isolator 112 in the ultraviolet laser device 21 according to the second embodiment. In the second embodiment, the flowchart of FIG. 16 is applied instead of the flowchart of FIG. 9. The flowchart shown in FIG. 16 will be described in terms of differences from that shown in FIG. 9.

The flowchart of FIG. 16 includes step S12C, step S16C, step S17C, and step S18C in place of step S12, step S16, step S17, and step S18 of FIG. 9.

In step S12C, in the ultraviolet laser device 21, the sensor SE8 measures an output initial value P8i and the processor 140 stores the output initial value P8i. In subsequent steps, the processor 140 monitors the respective outputs of the sensor SE6 and the sensor SE8 during the laser radiation.

When the determination result of step S14 is Yes, the processor 140 proceeds to step S16C. In step S16C, in the ultraviolet laser device 21, the sensor SE8 measures an output P8c and the processor 140 stores the output P8c.

Then, in step S17C, the processor 140 determines whether or not the output P8c of the sensor SE8 is equal to or more than the target value P8t. The target value P8t may be, for example, 80% of the output initial value P8i (P8t=P8i×0.8). The target value P8t is an example of the "fifth target value" in the present disclosure.

When the determination result of step S17C is No, that is, when the output P8c is less than the target value P8t, the processor 140 proceeds to step S18C. Details of the subroutine applied to step S18C will be described later with reference to FIG. 17. After step S18C, the processor 140 proceeds to step S19. Other steps may be similar to those in FIG. 9.

Figure 17:
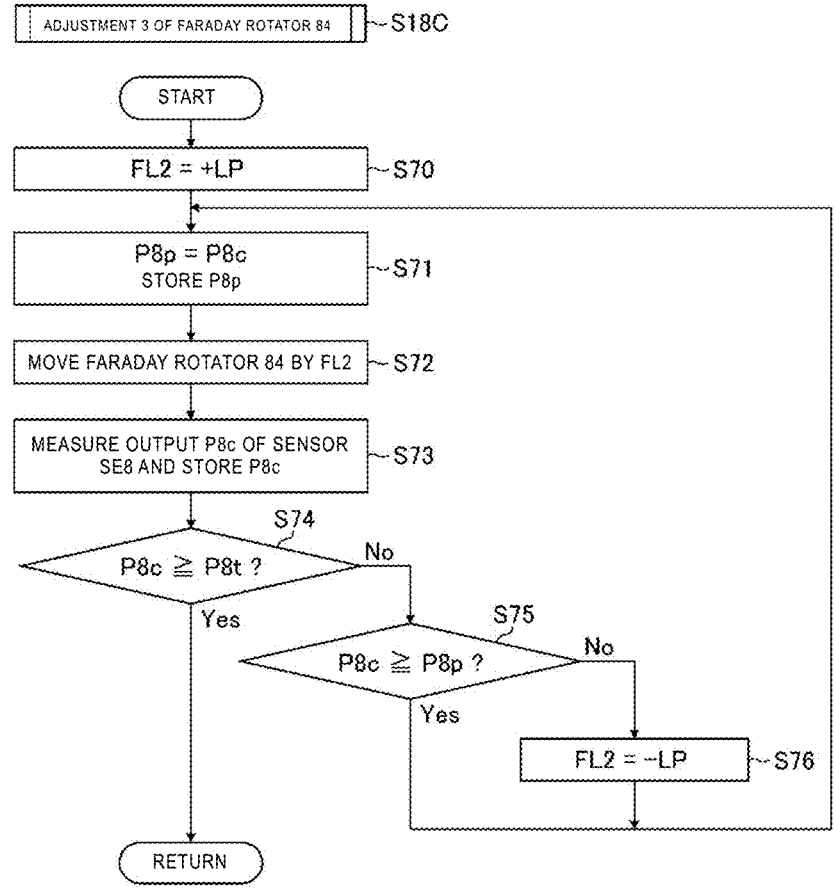
FIG. 17 is a flowchart showing an example of a processing content applied to step S18C of FIG. 16.

FIG. 17 is a flowchart showing an example of a processing content (adjustment 3 of the Faraday rotator 84) applied to step S18C of FIG. 16.

In step S70 of FIG. 17, the processor 140 sets the distance FL2 by which the Faraday material 85 is to be moved to +LP.

In step S71, the processor 140 stores the output P8c of the sensor SE8 as a pre-control output P8p.

Then, in step S72, the processor 140 causes the actuator 130 to move the Faraday material 85 of the Faraday rotator 84 by the distance FL2. After the Faraday material 85 is moved by FL2, in step S73, in the ultraviolet laser device 21, the sensor SE8 measures the output P8c and the processor 140 stores the output P8c.

In step S74, the processor 140 determines whether or not the output P8c is equal to or more than the target value P8t. When the determination result of step S74 is No, that is, when the output P8c of the sensor SE8 is less than the target value P8t, the processor 140 proceeds to step S75. In step S75, the processor 140 determines whether or not the output P8c is equal to or more than the pre-control output P8p.

When the determination result of step S75 is Yes, that is, when the output P8c is equal to or more than the pre-control output P8p (P8c≥P8p), the processor 140 returns to step S71. On the other hand, when the determination result of step S75 is No, that is, when the output P8c is less than the pre-control output P8p, the processor 140 proceeds to step S76 and sets the distance FL2 to −LP. After step S76, the processor 140 returns to step S71.

When the determination result of step S74 is Yes, that is, when the output P8c of the sensor SE8 is equal to or more than the target value P8t, the processor 140 ends the flowchart of FIG. 17 and returns to the flowchart of FIG. 16.

5.3 Effect

According to the second embodiment, the transmittance and the extinction ratio of the optical isolator 112 can be adjusted during laser radiation, and similar effects can be obtained as the first embodiment.

5.4 Modification 2-1

The second polarizer 88 in the configuration shown in FIG. 15 may not be arranged when there is no change between the polarization of the light transmitted through the optical isolator 112 toward the PO 26 and the polarization of the light returning from the PO 26 toward the optical isolator 112. That is, in the second embodiment, the second polarizer 88 may not be arranged on the optical path between the Faraday rotator 84 and the PO 26.

In the configuration in which the second polarizer 88 is not arranged, the following effects can be obtained.

[1] It is expected to improve the transmittance of the entire unit of the optical isolator 112.

[2] It is expected to reduce the size of the unit of the optical isolator 112.

5.5 Modification 2-2

Figure 18:
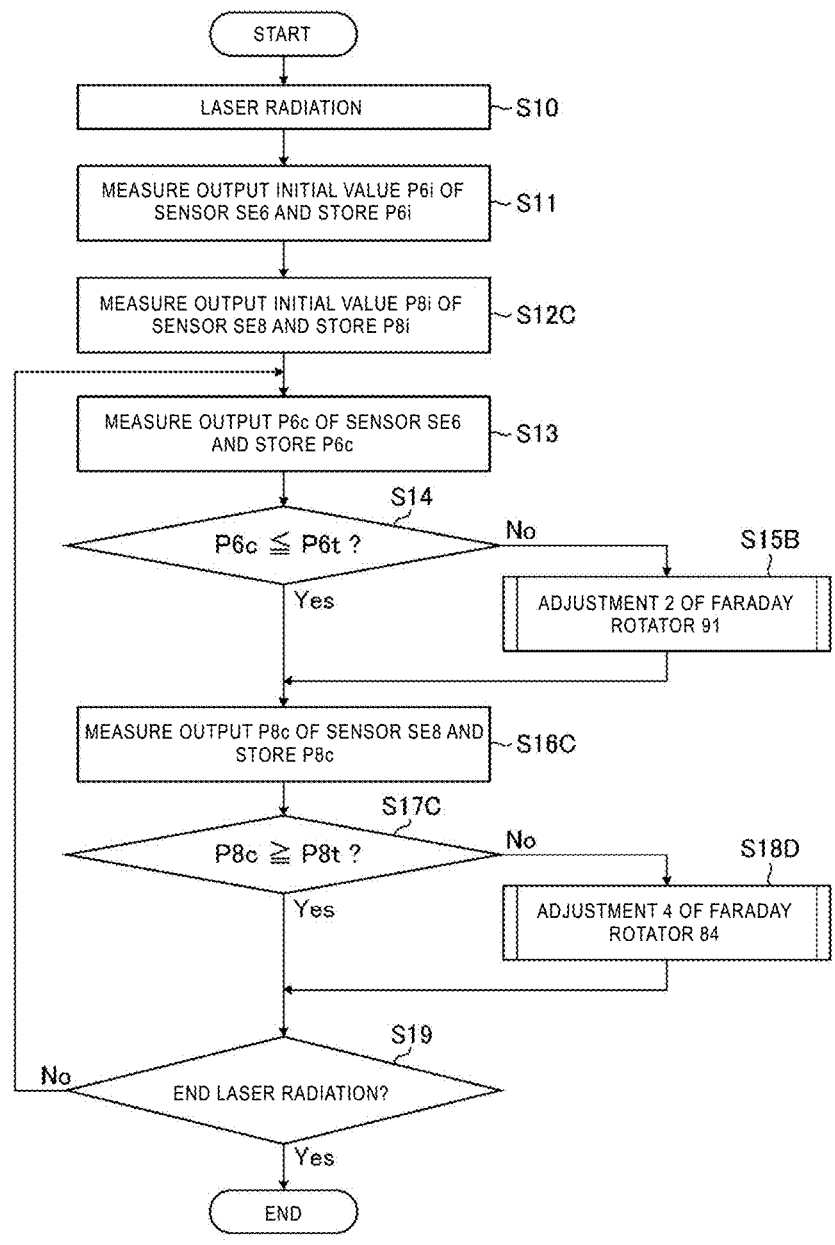
FIG. 18 is a flowchart showing another control example of the optical isolator in the ultraviolet laser device.
Figure 19:
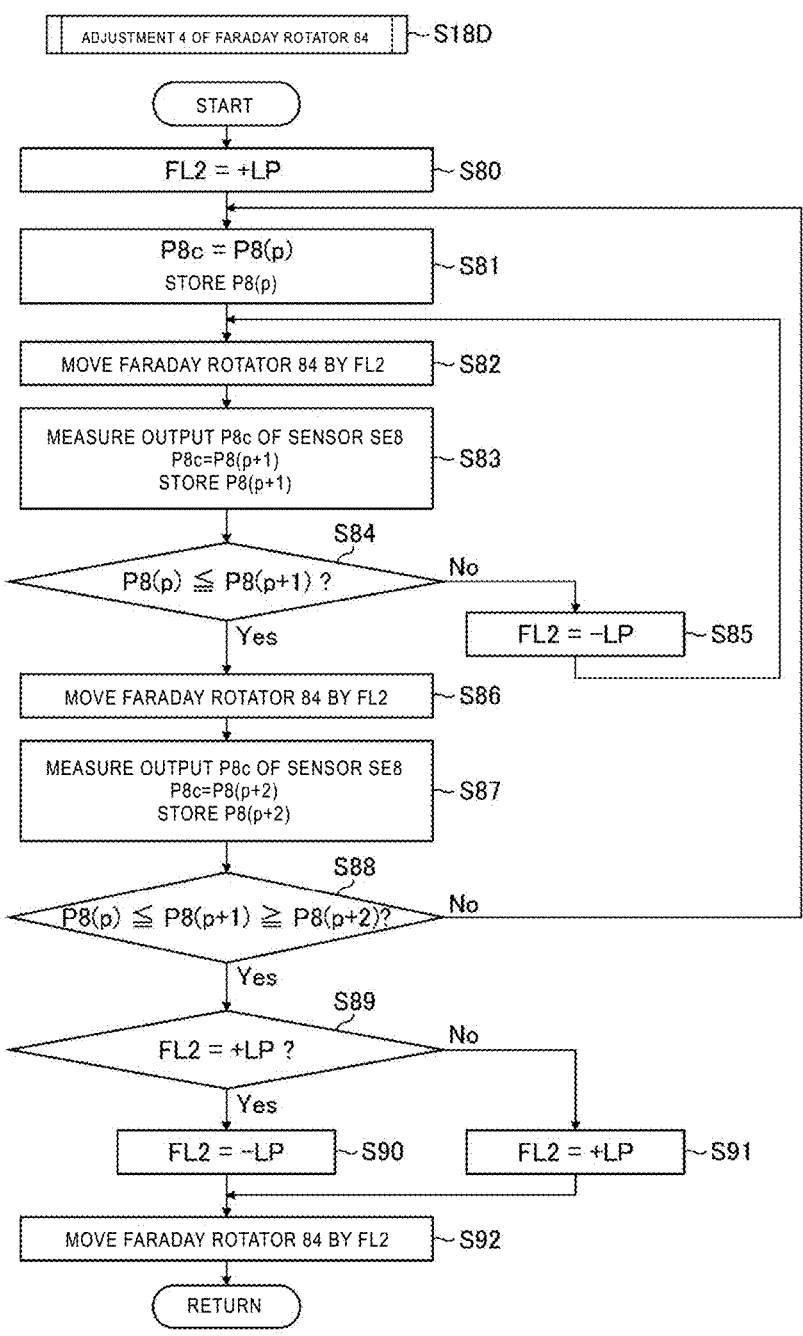
FIG. 19 is a flowchart showing an example of a processing content applied to step S18D of FIG. 18.

FIGS. 18 and 19 are flowcharts showing another control example of the optical isolator 112 in the ultraviolet laser device 21. Instead of the flowcharts of FIGS. 16 and 17, the flowcharts of FIGS. 18 and 19 may be adopted. The flowcharts shown in FIGS. 18 and 19 will be described in terms of differences from those shown in FIGS. 16 and 17.

In the flowchart of FIG. 18, steps S15B and S18D are included in place of steps S15 and S18C of FIG. 16.

When the determination result of step S14 is No, the processor 140 proceeds to step S15B and performs the process of adjustment 2 of the Faraday rotator 91. Details of the subroutine applied to step S15B are as described with reference to FIG. 13.

Further, when the determination result of step S17C is No, the processor 140 proceeds to step S18D and performs the process of adjustment 4 of the Faraday rotator 84. Details of the subroutine applied to step S18D will be described later with reference to FIG. 19. After step S18D, the processor 140 proceeds to step S19. Other steps may be similar to those in FIG. 16.

FIG. 19 is a flowchart showing an example of a processing content (adjustment 4 of the Faraday rotator 84) applied to step S18D of FIG. 18. In the flowchart of FIG. 17, the example in which the output P8c of the sensor SE8 is controlled to be equal to or more than the target value P8t has been described, but the flowchart shown in FIG. 19 is an example in which the output P8c of the sensor SE8 is controlled to be the maximum value.

In step S80 of FIG. 19, the processor 140 sets the distance FL2 by which the Faraday material 85 is to be moved to +LP.

In step S81, the processor 140 stores the output P8c of the sensor SE8 as the output P8(p) of the index p.

Then, in step S82, the processor 140 causes the actuator 130 to move the Faraday material 85 of the Faraday rotator 84 by the distance FL2. After the Faraday material 85 is moved by FL2, in step S83, in the ultraviolet laser device 21, the sensor SE8 measures the output P8c and the processor 140 stores the output P8c as the output P8(p+1) of the index p+1.

Then, in step S84, the processor 140 determines whether or not P8(p+1) is equal to or more than P8(p). This determination is used to determine the direction of movement of the Faraday material 85. When the determination result of step S84 is No, that is, when P8(p)>P8(p+1) is satisfied, the processor 140 proceeds to step S85. In step S85, the processor 140 sets the distance FL2 to −LP and reverses the movement direction. After step S85, the processor 140 returns to step S82.

On the other hand, When the determination result of step S84 is Yes, that is, when P8(p)≤P8(p+1) is satisfied, the processor 140 proceeds to step S86.

In step S86, the processor 140 causes the actuator 130 to move the Faraday material 85 of the Faraday rotator 84 by the distance FL2.

Then, in step S87, in the ultraviolet laser device 21, the sensor SE8 measures the output P8*c* and the processor 140 stores the output P8c as the output P8(p+2) of the index p+2.

Then, in step S88, the processor 140 determines whether or not P8(p)≤P8(p+1)≥P8(p+2) is satisfied. This determination is used for searching the maximum value. The maximum value of the output P8c of the sensor SE8 is an example of the "sixth target value" in the present disclosure. When the determination result of step S88 is No, that is, when P8(p+2) is more than P8(p+1), since the maximum value cannot be specified, the processor 140 returns to step S81 and repeats steps S81 to S88.

On the other hand, when the determination result of step S88 is Yes, that is, when P8(p)≤P8(p+1)≥P8(p+2) is satisfied, the processor 140 specifies that P8(p+1) is the maximum value and proceeds to step S89.

In step S89, the processor 140 determines whether or not the setting of the distance FL2 is +LP. When the determination result of step S89 is Yes, that is, when the distance FL2 of the movement at the time when the output P8(p+2) is obtained is +LP, the processor 140 proceeds to step S90 and sets the distance FL2 to −LP.

On the other hand, when the determination result of step S89 is No, that is, when the distance FL2 of the movement at the time when the output P8(p+2) is obtained is −LP, the processor 140 proceeds to step S91 and sets the distance FL2 to +LP.

After step S90 or step S91, the processor 140 proceeds to step S92. In step S92, the processor 140 operates the actuator 130 to move the Faraday material 85 of the Faraday rotator

84 by the distant FL2 with respect to the magnet 86. Due to step S92, the Faraday material 85 moves to a position corresponding to the index p+1 at which the output P8c of the sensor SE8 is determined to be the maximum value. After step S92, the processor 140 ends the flowchart of FIG. 19 and returns to the flowchart of FIG. 18.

By applying the control method of Modification 2-2, similar effects can be obtained as the second embodiment.

5.6 Others

In the second embodiment as well, an optical system such as the half-wave plate 81 may be adopted instead of the Faraday rotator 91 as in the modification 1-2 of the first embodiment.

6. Third embodiment

6.1 Configuration

Figure 20:
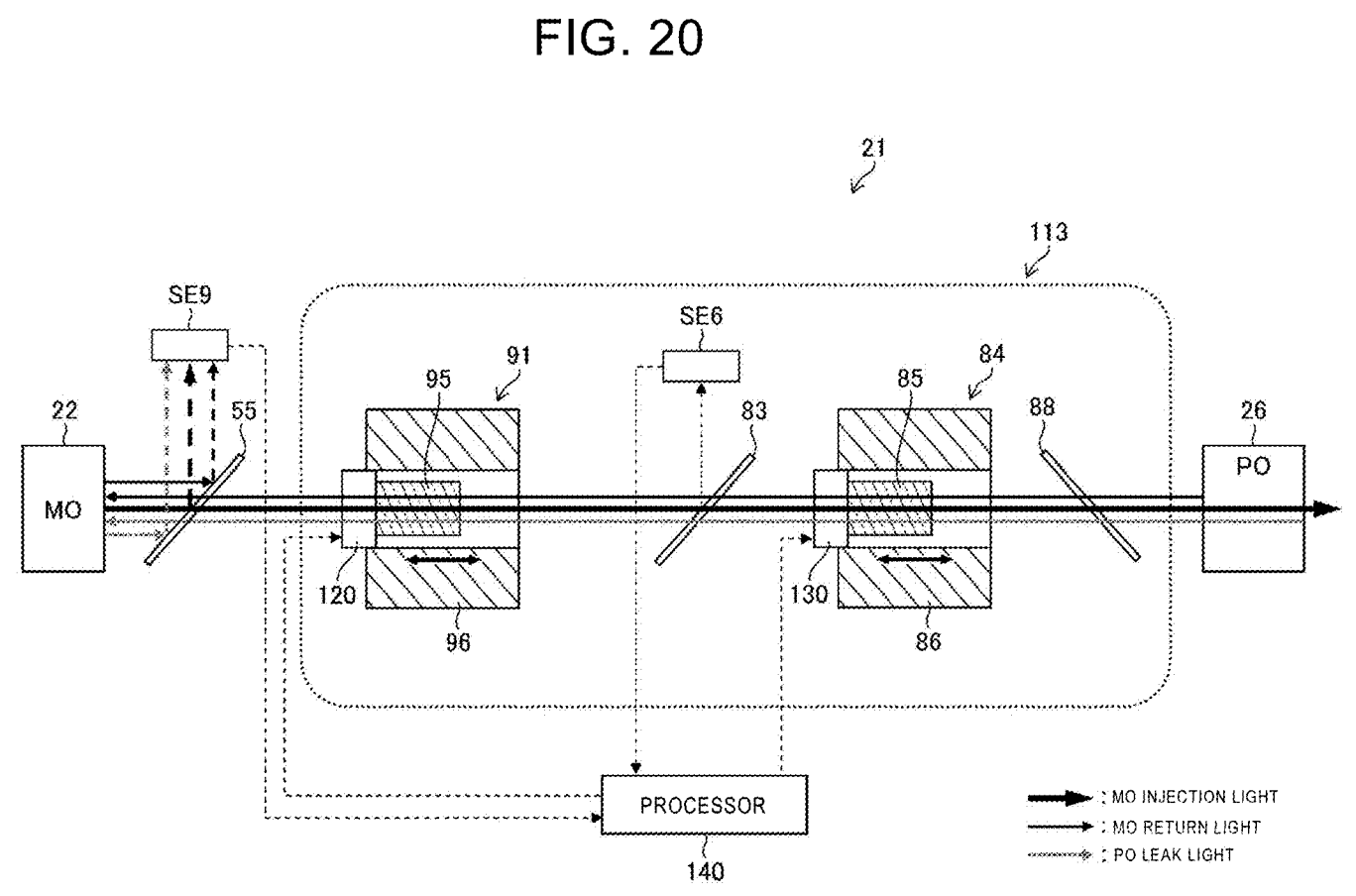

FIG. 20 schematically shows the configuration of the ultraviolet laser device 21 including an optical isolator 113 according to a third embodiment.

The configuration shown in FIG. 20 will be described in terms of differences from the configuration shown in FIG. 6. The sensor SE7 in FIG. 6 is not arranged in the optical isolator 113 shown in FIG. 20. The third embodiment has a configuration that utilizes a measurement value of a sensor SE9, in place of the sensor SE7, of the MO pulse energy monitor 54 arranged between the MO 22 and the optical isolator 113. The sensor SE9 may be the optical sensor 56 described with reference to FIG. 1. Other configurations are similar to those in the first embodiment. The sensor SE9 is an example of the "fourth sensor" in the present disclosure.

6.2 Operation

Light entering the sensor SE9 includes MO injection light, MO return light, and PO leak light, and the sensor SE9 measures the output of these MO injection light, MO return light, and PO leak light.

The MO injection light has a constant value, and the MO return light and the PO leak light each have a constant value as long as the effect of the optical isolator 113 is constant.

Since a change in the output (measurement value) of the sensor SE9 means that there is a change in the effect of the optical isolator 113, the processor 140 controls the position of the Faraday material 85 via the actuator 130 so that the output of the sensor SE9 becomes less than a prescribed value.

Figure 21:
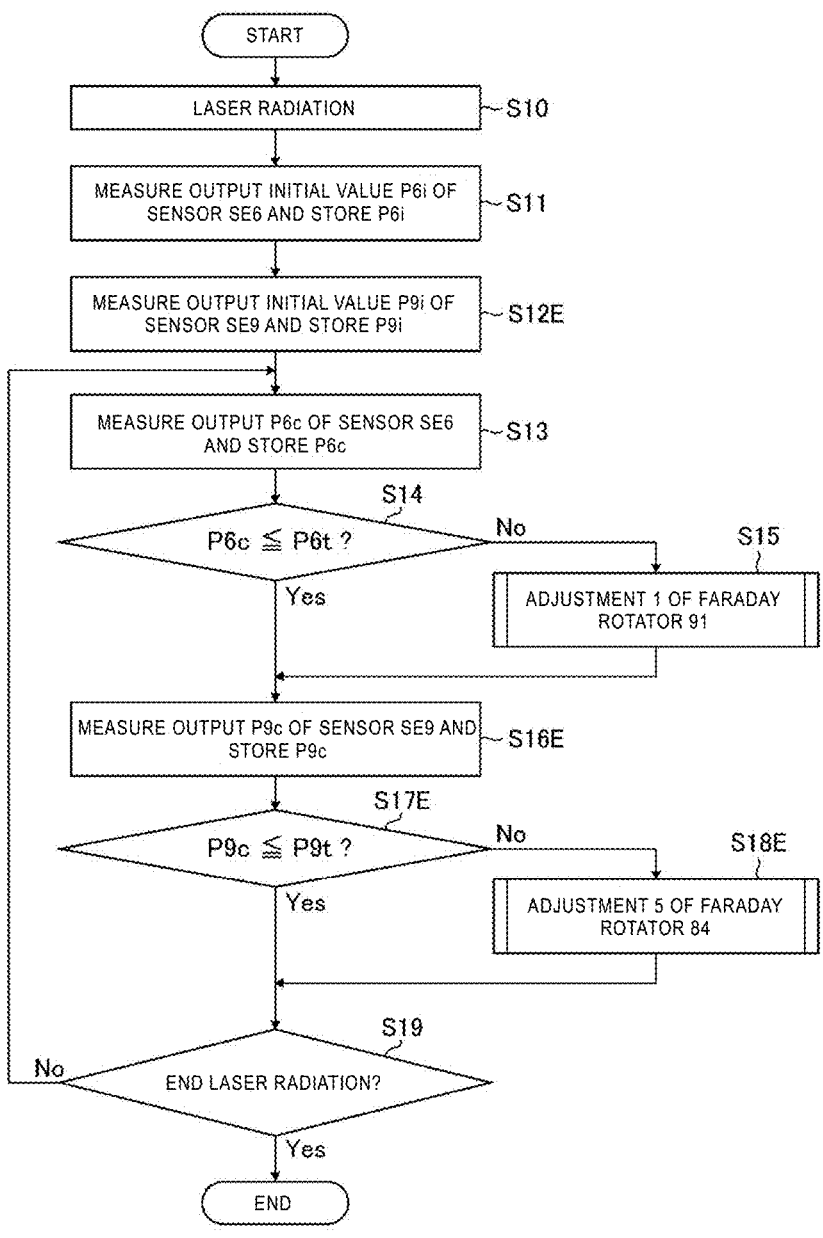
FIG. 21 is a flowchart showing a control example including the optical isolator in the ultraviolet laser device according to a third embodiment.

FIG. 21 is a flowchart showing a control example of the optical isolator 113 in the ultraviolet laser device 21. The flowchart shown in FIG. 21 will be described in terms of differences from that shown in FIG. 9.

The flowchart of FIG. 21 includes step S12E, step S16E, step S17E, and step S18E in place of step S12, step S16, step S17 and step S18 of FIG. 9.

In step S12E, in the ultraviolet laser device 21, the sensor SE9 measures an output initial value P9i and the processor 140 stores the output initial value P9i. In subsequent steps, the processor 140 monitors the respective outputs of the sensor SE6 and the sensor SE9 during the laser radiation.

When the determination result of step S14 is Yes, the processor 140 proceeds to step S16E. In step S16E, in the ultraviolet laser device 21, the sensor SE9 measures an output P9c and the processor 140 stores the output P9c.

Then, in step S17E, the processor 140 determines whether or not the output P9c of the sensor SE9 is equal to or less than the target value P9t. The target value P9t may be, for example, 120% of the output initial value P9i (P9t=P9i×1.2).

When the determination result of step S17E is No, that is, when the output P9c is more than the target value P9t, the processor 140 proceeds to step S18E. An example of the subroutine applied to step S18E will be described later with reference to FIG. 22. Other steps may be similar to those in the flowchart of FIGS. 9 and 10.

Figure 22:
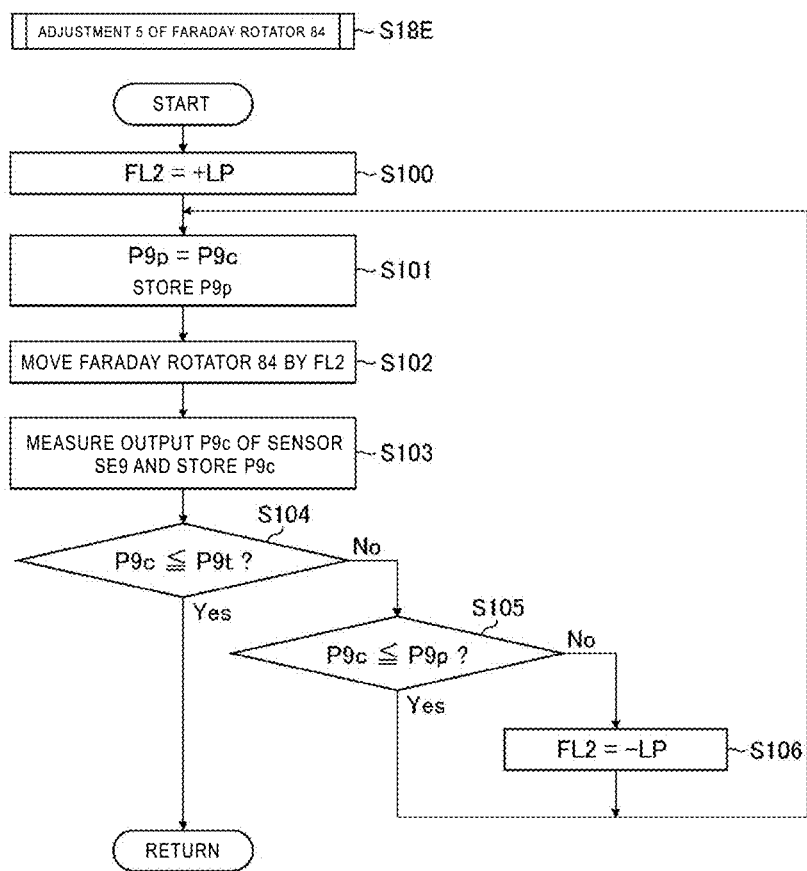
FIG. 22 is a flowchart showing an example of a processing content applied to step S18E of FIG. 21.

FIG. 22 is a flowchart showing an example of a processing content (adjustment 5 of the Faraday rotator 84) applied to step S18E of FIG. 21.

In step S100, the processor 140 sets the distance FL2 by which the Faraday material 85 is to be moved to +LP.

In step S101, the processor 140 stores the output P9c of the sensor SE9 as a pre-control output P9p.

Then, in step S102, the processor 140 causes the actuator 130 to move the Faraday material 85 by the distance FL2. After the Faraday material 85 is moved by FL2, in step S103, in the ultraviolet laser device 21, the sensor SE9 measures the output P9c and the processor 140 stores the output P9c.

In step S104, the processor 140 determines whether or not the output P9c of the sensor SE9 is equal to or less than the target value P9t. When the determination result of step S104 is No, that is, when the output P9c of the sensor SE9 is more than the target value P9t, the processor 140 proceeds to step S105.

In step S105, the processor 140 determines whether or not the output P9c is equal to or less than the pre-control output P9p. When the determination result of step S105 is Yes, that is, when the output P9c is equal to or less than the pre-control output P9p, the processor 140 returns to step S101. On the other hand, when the determination result of step S105 is No, that is, when the output P9c is more than the pre-control output P9p, the processor 140 proceeds to step S106 and sets the distance FL2 to −LP. After step S106, the processor 140 returns to step S101.

When the determination result of step S104 is Yes, that is, when the output P9c of the sensor SE9 is equal to or less than the target value P9t, the processor 140 ends the flowchart of FIG. 22 and returns to the flowchart of FIG. 21.

6.3 Effect

According to the third embodiment, similar effects can be obtained as the first embodiment.

6.4 Modification 3

In the third embodiment, similarly to the modification 1-1 of the first embodiment, it is possible to adopt the control in which the outputs of the sensors SE6, SE9 are each the minimum value. Further, in the third embodiment as well, an optical system such as the half-wave plate 81 may be adopted instead of the Faraday rotator 91 as in the modification 1-3 of the first embodiment.

7. Other Configuration Examples of Ultraviolet Laser Device

Not limited to the configuration including a Fabry-Perot resonator such as the PO 26 shown in FIG. 2, the amplification stage laser may have a configuration including a ring resonator. Alternatively, the amplification stage laser is not limited to the configuration including an optical resonator, and may be simply an amplifier. For example, the amplification stage laser may be a multi-pass amplifier such as a three-pass amplifier that performs amplification by causing the seed light to pass through the discharge space three times with reflection by cylindrical mirrors.

The oscillation stage laser is not limited to a line narrowing gas laser such as the MO 22 shown in FIG. 2, and may be an ultraviolet solid-state laser that outputs pulse laser light having an ultraviolet wavelength. For example, the oscillation stage laser may be a solid-state laser that oscillates at a wavelength of about 193.4 nm, or an ultraviolet solid-state laser that outputs fourth harmonic light of a titanium-sapphire laser (wavelength of about 774 nm).

8. Electronic Device Manufacturing Method

Figure 23:
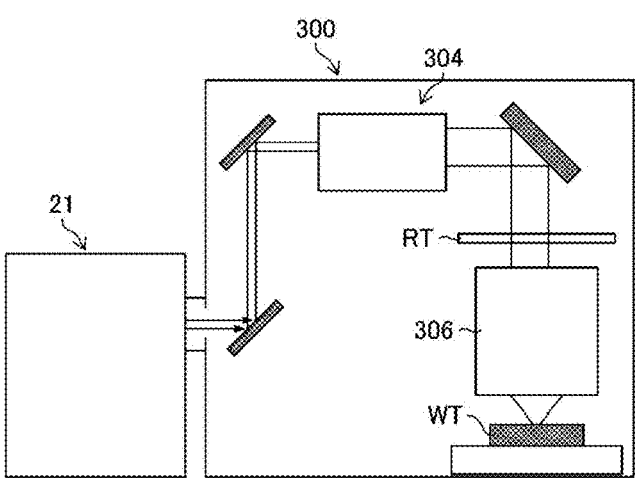
FIG. 23 schematically shows a configuration example of an exposure apparatus.

FIG. 23 schematically shows a configuration example of an exposure apparatus 300. The exposure apparatus 300 includes an illumination optical system 304 and a projection optical system 306. The ultraviolet laser device 21 generates laser light and outputs the laser light to the exposure apparatus 300. The illumination optical system 304 illuminates a reticle pattern of a reticle (not shown) arranged on a reticle stage RT with laser light incident from the ultraviolet laser device 21. The projection optical system 306 causes the laser light transmitted through the reticle to be imaged as being reduced and projected on a workpiece (not shown) arranged on a workpiece table WT. The workpiece is a photosensitive substrate such as a semiconductor wafer on which photoresist is applied.

The exposure apparatus 300 synchronously translates the reticle stage RT and the workpiece table WT to expose the workpiece to the laser light reflecting the reticle pattern. After the reticle pattern is transferred onto the semiconductor wafer by the exposure process described above, a semiconductor device can be manufactured through a plurality of processes. The semiconductor device is an example of the "electronic device" in the present disclosure.

9. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. An ultraviolet laser device, comprising:
an oscillation stage laser configured to output linearly polarized pulse laser light having an ultraviolet wavelength;
an amplifier including an optical resonator, and configured to amplify and output the pulse laser light;
an optical isolator arranged on an optical path between the oscillation stage laser and the amplifier; and
a processor,
the optical isolator including:
a first polarizer arranged so that the pulse laser light output from the oscillation stage laser is transmitted therethrough;
a first Faraday rotator including a first magnet and a first Faraday material, and configured to rotate a polarization direction of the pulse laser light transmitted through the first polarizer in a first rotation direction;

a second polarizer arranged so that the pulse laser light output from the first Faraday rotator is transmitted therethrough;

a first actuator configured to relatively move the first magnet and the first Faraday material in an optical axis direction of the pulse laser light; and a first sensor configured to measure a power of pulse laser light reflected by the second polarizer among the pulse laser light output from the oscillation stage laser; and the processor controlling the first actuator based on a measurement result of the first sensor.

2. The ultraviolet laser device according to claim 1, wherein the processor controls the first actuator so that the measurement result of the first sensor becomes equal to or less than a first target value.

3. The ultraviolet laser device according to claim 1, wherein the processor controls the first actuator so that the measurement result of the first sensor becomes a second target value.

4. The ultraviolet laser device according to claim 1, wherein the first actuator moves the first Faraday material with respect to the first magnet.

5. The ultraviolet laser device according to claim 1, wherein the first magnet is a permanent magnet.

6. The ultraviolet laser device according to claim 1, wherein the processor controls the first actuator during operation of the oscillation stage laser.

7. The ultraviolet laser device according to claim 6, wherein the processor controls the first actuator when the measurement result of the first sensor becomes more than a first target value.

8. The ultraviolet laser device according to claim 1, wherein the optical isolator includes: on the oscillation stage laser side of the first polarizer, a second Faraday rotator including a second magnet and a second Faraday material and configured to rotate a polarization direction of the pulse laser light output from the oscillation stage laser in a second rotation direction which is opposite to the first rotation direction;

a second actuator configured to relatively move the second magnet and the second Faraday material in an optical axis direction of the pulse laser light; and a second sensor configured to measure a power of the pulse laser light reflected by the first polarizer, and the processor controls the second actuator based on a measurement result of the second sensor.

9. The ultraviolet laser device according to claim 8, wherein the processor controls the second actuator so that the measurement result of the second sensor becomes equal to or less than a third target value.

10. The ultraviolet laser device according to claim 8, wherein the processor controls the second actuator so that the measurement result of the second sensor becomes a fourth target value.

11. The ultraviolet laser device according to claim 8, wherein the second actuator moves the second Faraday material with respect to the second magnet.

12. The ultraviolet laser device according to claim 1, wherein the oscillation stage laser is an ultraviolet solid-state laser.

13. The ultraviolet laser device according to claim 1, wherein the oscillation stage laser and the amplifier are each excimer lasers.

14. The ultraviolet laser device according to claim 1, wherein the first Faraday material is calcium fluoride.

15. An ultraviolet laser device comprising:

an oscillation stage laser configured to output linearly polarized pulse laser light having an ultraviolet wavelength;

an amplifier including an optical resonator, and configured to amplify and output the pulse laser light;

an optical isolator arranged on an optical path between the oscillation stage laser and the amplifier; and a processor, the optical isolator including:

a first polarizer arranged so that the pulse laser light output from the oscillation stage laser is transmitted therethrough;

a first Faraday rotator including a first magnet and a first Faraday material, and configured to rotate a polarization direction of the pulse laser light transmitted through the first polarizer in a first rotation direction;

a first actuator configured to relatively move the first magnet and the first Faraday material in an optical axis direction of the pulse laser light; and a first sensor configured to measure a power of light reflected by the first polarizer among light returning from the amplifier to the oscillation stage laser, and the processor controlling the first actuator based on a measurement result of the first third sensor.

16. The ultraviolet laser device according to claim 15, wherein the processor controls the first actuator so that the measurement result of the first sensor becomes equal to or more than a fifth target value.

17. The ultraviolet laser device according to claim 15, wherein the processor controls the first actuator so that the measurement result of the first sensor becomes a sixth target value.

18. An ultraviolet laser device comprising:

an oscillation stage laser configured to output linearly polarized pulse laser light having an ultraviolet wavelength;

an amplifier including an optical resonator, and configured to amplify and output the pulse laser light;

an optical isolator arranged on an optical path between the oscillation stage laser and the amplifier;

a beam splitter arranged on an optical path between the oscillation stage laser and the optical isolator;

a first sensor configured to measure a power of light reflected by the beam splitter; and a processor, the optical isolator including:

a first polarizer arranged so that the pulse laser light output from the oscillation stage laser is transmitted therethrough;

a first Faraday rotator including a first magnet and a first Faraday material, and configured to rotate a polarization direction of the pulse laser light transmitted through the first polarizer in a first rotation direction; and a first actuator configured to relatively move the first magnet and the first Faraday material in an optical axis direction of the pulse laser light; and the processor controlling the first actuator based on a measurement result of the first sensor.

19. An electronic device manufacturing method, comprising:

generating laser light amplified by an amplifier using an ultraviolet laser device;

outputting the amplified laser light to an exposure apparatus; and exposing a photosensitive substrate to the laser light in the exposure apparatus to manufacture an electronic device, the ultraviolet laser device including:

an oscillation stage laser configured to output linearly polarized pulse laser light having an ultraviolet wavelength;

the amplifier including an optical resonator, and configured to amplify and output the pulse laser light;

an optical isolator arranged on an optical path between the oscillation stage laser and the amplifier; and a processor, the optical isolator including:

a first polarizer arranged so that the pulse laser light output from the oscillation stage laser is transmitted therethrough;

a first Faraday rotator including a first magnet and a first Faraday material, and configured to rotate a polarization direction of the pulse laser light transmitted through the first polarizer in a first rotation direction;

a second polarizer arranged so that the pulse laser light output from the first Faraday rotator is transmitted therethrough;

a first actuator configured to relatively move the first magnet and the first Faraday material in an optical axis direction of the pulse laser light; and a first sensor configured to measure a power of pulse laser light reflected by the second polarizer among the pulse laser light output from the oscillation stage laser; and the processor controlling the first actuator based on a measurement result of the first sensor.

20. An electronic device manufacturing method, comprising:

generating laser light amplified by an amplifier using an ultraviolet laser device;

outputting the amplified laser light to an exposure apparatus; and exposing a photosensitive substrate to the laser light in the exposure apparatus to manufacture an electronic device, the ultraviolet laser device including:

an oscillation stage laser configured to output linearly polarized pulse laser light having an ultraviolet wavelength;

the amplifier including an optical resonator, and configured to amplify and output the pulse laser light;

an optical isolator arranged on an optical path between the oscillation stage laser and the amplifier; and a processor, the optical isolator including:

a first polarizer arranged so that the pulse laser light output from the oscillation stage laser is transmitted therethrough;

a first Faraday rotator including a first magnet and a first Faraday material, and configured to rotate a polarization direction of the pulse laser light transmitted through the first polarizer in a first rotation direction;

a first actuator configured to relatively move the first magnet and the first Faraday material in an optical axis direction of the pulse laser light; and a first sensor configured to measure a power of light reflected by the first polarizer among light returning from the amplifier to the oscillation stage laser, and the processor controlling the first actuator based on a measurement result of the first sensor.

21. The ultraviolet laser device according to claim 1, wherein the oscillation stage laser includes a line narrowing module configured to narrow a spectrum line width of the pulse laser light.

\*  \*  \*  \*  \*